United States Patent
Suzuki et al.

(10) Patent No.: US 7,700,899 B2
(45) Date of Patent: Apr. 20, 2010

(54) HEATING DEVICE OF THE LIGHT IRRADIATION TYPE

(75) Inventors: Shinji Suzuki, Tokyo-to (JP); Kyohei Seki, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 515 days.

(21) Appl. No.: 11/565,112

(22) Filed: Nov. 30, 2006

(65) Prior Publication Data

US 2007/0120227 A1 May 31, 2007

(30) Foreign Application Priority Data

Nov. 30, 2005 (JP) .............................. 2005-346983

(51) Int. Cl.
*A21B 1/00* (2006.01)

(52) U.S. Cl. ..................... 219/413; 219/412; 219/391

(58) Field of Classification Search ................. 219/391, 219/412, 413
See application file for complete search history.

(56) References Cited

U.S. PATENT DOCUMENTS

| | | | |
|---|---|---|---|
| 5,386,491 A * | 1/1995 | Mewissen et al. | 392/418 |
| 5,951,896 A * | 9/1999 | Mahawili | 219/411 |
| 6,081,072 A | 6/2000 | Suzuki | |
| 6,163,648 A | 12/2000 | Moto et al. | |
| 6,876,816 B2 * | 4/2005 | Shigeoka et al. | 392/411 |
| 6,965,093 B2 * | 11/2005 | Falter | 219/390 |

FOREIGN PATENT DOCUMENTS

| | | |
|---|---|---|
| DE | 100 24 709 A1 | 11/2001 |
| EP | 1 091 622 A2 | 4/2001 |
| JP | 4329253 A | 11/1992 |
| JP | 7016353 U | 3/1995 |
| JP | 2003031517 A | 1/2003 |

* cited by examiner

*Primary Examiner*—Thor S Campbell
(74) *Attorney, Agent, or Firm*—David S. Safran; Roberts Mlotkowski Safran & Cole, P.C.

(57) ABSTRACT

To devise a heating device of the light irradiation type in which costs can reduced by reducing the number of filament lamps and current source parts without adversely affecting the illuminance distribution with respect to a wafer, in a heating device of the light irradiation type that has a light source part, in which several filament lamps are located parallel to one another, in which at least one of the filament lamps has several filaments which are located along the bulb axis are supplied with power individually to produce light which is irradiated from the light source parts onto an article to be treated, the distance between at least some of the adjacent filament lamps to one another is nonuniform.

8 Claims, 14 Drawing Sheets

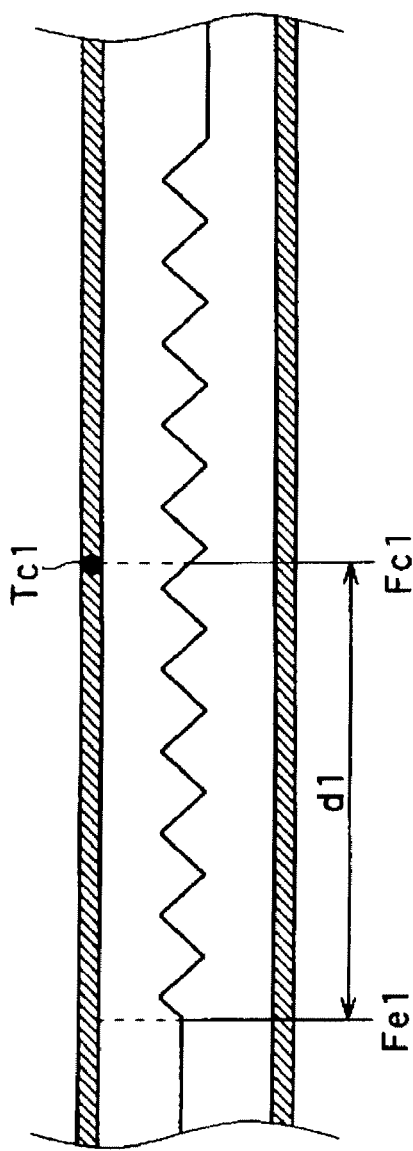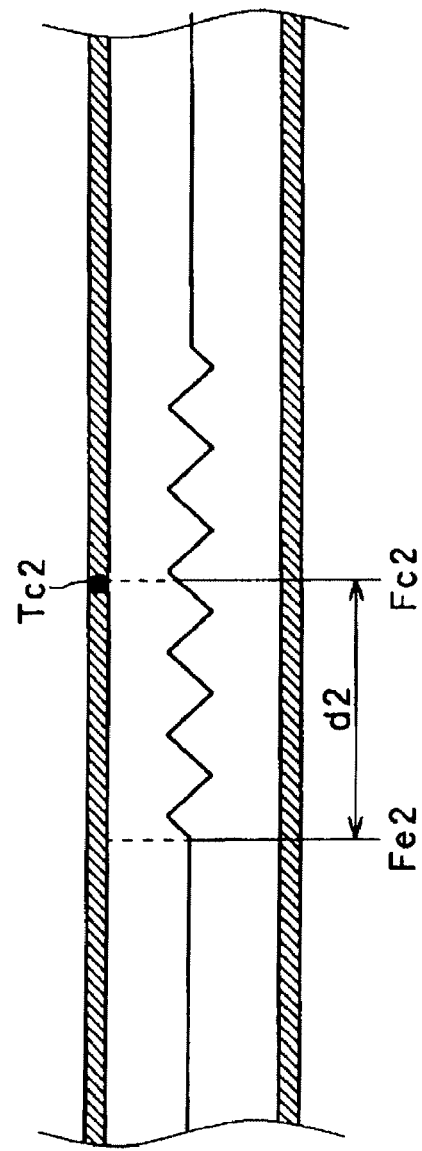

Fig. 12

Table 1

| | | 1F~1J | 1E,1K | 1D,1L | 1C,1M | 1A,1B,1N,1O |
|---|---|---|---|---|---|---|
| W (W/cm) in formula 1 | Filament above center area 62 of wafer | 190 | 175 | 160 | 145 | — |
| | Filament above outer edge area 61 of wafer | 230 | 211 | 192 | 173 | 154 |
| | D1 (mm) in formula 1 | 24 | 24 | 20 | 20 | 16 |
| | D2 (mm) in formula 1 | 24 | 20 | 20 | 16 | 16 |

Table 2

| | | 1H~1L | 1G,1M | 1F,1N | 1E,1O | 1C,1D,1P,1Q | 1A,1B,1R,1S |
|---|---|---|---|---|---|---|---|
| W (W/cm) in formula 1 | Filament above wafer 6 | 190 | 175 | 160 | — | — | — |
| | Filament above inner circumference area 52 of guard ring | 290 | 265 | 240 | 215 | 190 | — |
| | Filament above outer circumference area 51 of guard ring | 345 | 318 | 288 | 259 | 230 | 230 |
| | D1 (mm) in formula 1 | 24 | 24 | 20 | 20 | 16 | 16 |
| | D2 (mm) in formula 1 | 24 | 20 | 20 | 16 | 16 | 16 |

Table 3

| | Type of filament lamp | 1H~1L | 1G,1M | 1F,1N | 1E,1O | 1C,1D,1P~1Q | 1A~1D,1P~1S |
|---|---|---|---|---|---|---|---|
| W (W/cm) in formula 1 | Filament above wafer 6 | 190 | 175 | 160 | — | — | — |
| | Filament above guard ring 5 | 290 | 265 | 240 | 215 | 190 | — |
| | D1 (mm) in formula 1 | 24 | 24 | 20 | 20 | 16 | 16 |
| | D2 (mm) in formula 1 | 24 | 20 | 20 | 16 | 16 | 16 |

HEATING DEVICE OF THE LIGHT IRRADIATION TYPE

BACKGROUND OF THE INVENTION

1. Field of the Invention

The invention relates to a heating device of the light irradiation type in which a plate-shaped article to be treated, especially a semiconductor wafer, is subjected to rapid heating, holding at a high temperature, and rapid cooling for layer formation, diffusion, annealing or for similar purposes.

2. Description of Related Art

Heat treatment of the light irradiation type in the production of semiconductors, such as layer formation, diffusion, annealing or the like, in carried out in diverse ways. In each of these treatments, a semiconductor wafer (hereinafter also called only a wafer) which is a plate-shaped article to be treated or the like, is heated to a high temperature. If heat treatment of the light irradiation type is used for this heat treatment, the wafer can be quickly heated and its temperature raised in a few seconds to a few dozen seconds to at least 1000° C. When light irradiation is stopped, it can be quickly cooled. However, when a nonuniformity of the temperature distribution occurs in the semiconductor wafer, especially at a temperature of at least 1050° C., a phenomenon called slip occurs in the wafer, i.e., a defect of crystal transition. In this connection, there is the danger that scrap will be formed. Therefore, it is necessary in heat treatment of the wafer using a heating device of the light irradiation type to carry out heating, holding at a high temperature and cooling such that the temperature distribution of the wafer is made uniform. In the case of heating of the wafer for layer formation, to form a layer with a uniform thickness, the wafer must likewise be heated such that the temperature distribution of the wafer is made uniform.

Even if the entire surface of the wafer is irradiated with a uniform irradiance, while in a heating device of the light irradiation type the wafer is kept in the high temperature state, there are cases in which the temperature of the peripheral region of the wafer is low and the temperature distribution of the wafer becomes nonuniform, and in which the above described slip occurs. The reason for the temperature drop of the peripheral wafer region is that heat is radiated from the side of the wafer. The heat radiation from the wafer side causes in the wafer a heat flow, by which a temperature distribution is formed. In order to make the temperature uniform over the entire surface of the wafer, therefore the peripheral region of the wafer must be irradiated with light with a greater irradiance than in the center region of the wafer according to the amount of temperature drop as a result of heat radiation from the wafer side.

On the other hand, as one of the processes for preventing a temperature drop in the peripheral region of the wafer, ordinarily a process was proposed in which auxiliary material with the same heat capacity as the wafer is arranged such that the outer periphery of the wafer is surrounded by it. This auxiliary material is generally called a guard ring.

A case is imagined in which the wafer and guard ring are heated together with uniform light irradiation by the wafer and guard ring being regarded as a one-piece, individual virtual plate body. In this case, no heat radiation arises from the wafer side since the peripheral region of the wafer does not become the peripheral region of the above described virtual plate body. The temperature of the peripheral region of the wafer therefore does not drop. Since the guard ring is arranged such that the outside periphery of the wafer is surrounded by it, it can also act as wafer holding material when it acquires an additional means with which the peripheral edge region of the wafer is held fast. Therefore, there are many cases in which the guard ring is designed to hold the wafer fast. This means that the guard ring is a component designed to equalize the temperature drop which occurs due to heat radiation from the side of the wafer or from its vicinity, and to make the wafer temperature uniform. There are also many cases in which the guard ring is used as a wafer holding material.

However, in fact, it is difficult to produce the guard ring such that it can be considered integral with the wafer, i.e., that the heat capacities are the same. The reasons for this are the following:

1. It is very hard to produce the guard ring from the same material as the wafer. If the guard ring is produced from silicon (Si), which is the same material as the wafer, the heat capacities of the wafer and the guard ring can be made the same. Processing of silicon into a form with which the wafer is held fast is however very difficult. If it is repeatedly exposed to a large temperature difference, it deforms, by which it can no longer be used as a guard ring.

2. A material which can be processed relatively easily and which has a heat capacity with a value somewhat greater than silicon, but close to it, is silicon carbide (SiC) which is generally used for guard rings. However, since the thickness of silicon carbide cannot be made smaller than 1 mm due to processing problems (yield), it is greater than the wafer thickness of 0.7 mm to 0.8 mm.

3. Due to the difference between the specific heat of the above described silicon and the specific heat of the silicon carbide and to the difference between the thicknesses, the heat capacity of the guard ring when heated to a high temperature is roughly 1.5 times greater per unit of area than that of the wafer. In order to eliminate the above described difference between the heat capacities of the wafer and the guard ring, it is therefore necessary to irradiate the guard ring with light with a greater irradiance than the wafer.

The guard ring itself which holds the wafer is, on the other hand, supported in the heat treatment space of the heating device of the light irradiation type by a support which consists of silica glass or a ceramic such as silicon carbide or the like and is located in a metallic chamber as a component of the heat treatment space. The support generally supports the outer peripheral region of the guard ring. Since the support arrangement of the guard ring is made in the above described manner, in the outer peripheral region of the guard ring in addition to heat radiation from the side via the support, heat moves from the guard ring to the metallic chamber. Even if the guard ring is irradiated with light with a uniform irradiance, the temperature therefore drops in the outer peripheral region of the guard ring, causing a temperature distribution in the guard ring.

As was described above, a guard ring of silicon carbide or the like is produced with a smaller thickness. There are therefore cases in which the guard ring is damaged in the case of formation of stresses. If a stress which arises as a result of the temperature distribution in the above described outer peripheral region of the guard ring has exceeded an allowable value, the guard ring is damaged. If the guard ring is irradiated with light under the conditions of irradiance under which there is the possibility of damage of the guard ring by this stress, it is necessary to make the irradiance on the surface of the outer peripheral region of the guard ring greater than the irradiance on the surface at a point outside of the outer peripheral region of the guard ring and to reduce the deviation of the temperature distribution of the guard ring.

This means that both when using a guard ring and also when not using it, the outer peripheral region of the article to be treated (including the single virtual plate body in which the wafer and guard ring are formed integrally with one another) must be irradiated with light with a greater irradiance than the center region of the article to be treated.

FIGS. 1(a) & 1(b) each show an ideal distribution of the irradiance for making the wafer temperature uniform in light irradiation. FIG. 1(a) is a schematic of an ideal irradiance in the case of not using the guard ring. FIG. 1(b) is a schematic of an ideal irradiance in the case of using the guard ring. The x-axis is the distance from the center of the wafer. The central axes in these figures represent the center region of the wafer. The y-axis plots the relative values of the irradiance with which the surfaces of the wafer and the guard ring are irradiated. To simplify understanding, it is assumed that the distribution of the emissivity of the wafer surface is uniform. That is, it is assumed that the temperature of the wafer irradiated with light is proportional to the irradiance on the wafer surface.

As is shown in FIG. 1(a), for an ideal distribution of the irradiance in the case of not using a guard ring, the irradiance on the surface of the center region of the wafer is uniform. Furthermore the irradiance on the surface of the outer peripheral region of the wafer is greater than the irradiance on the surface of the center region of the wafer. This is used to equalize the temperature reduction by heat radiation from the edge face of the wafer.

On the other hand, as is shown in FIG. 1(b), for an ideal distribution of the irradiance in the case of using a guard ring, the irradiance over the entire surface of the wafer is uniform since the guard ring suppresses the effect of heat radiation on the outer peripheral region of the wafer. The irradiance on the surface of the guard ring is greater than the irradiance on the wafer surface. In particular, the irradiance on the surface of the outer peripheral region of the wafer is greater than the irradiance on the surface of the guard ring except for the above described outer peripheral region.

The irradiance on the surface of the guard ring according to FIG. 1(b) is greater than the irradiance on the surface of the outer peripheral region of the wafer according to FIG. 1(a). It is used to equalize the amount by which the heat capacity of the guard ring is greater than the heat capacity of the wafer, as was described above.

The reason for the greater irradiance on the surface of the outer peripheral region of the guard ring than the irradiance on the surface of the guard ring except for the above described outer peripheral region is the suppression of the effect of the temperature drop which occurs in the above described outer peripheral region of the guard ring. Under the conditions of light irradiation under which the guard ring is not damaged as a result of the temperature decrease which occurs in the above described outer peripheral region of the guard ring, i.e., in the case in which the stress which is caused by irradiation is less than or equal to an allowable value, the distribution of the irradiation of the guard ring can also be uniform.

FIG. 2 is a schematic of the arrangement of one example of a prior art heating device of the light irradiation type. FIG. 3 is a schematic of the positional relationships of the filament lamps, the wafer and the guard ring relative to one another for a heating device of the light irradiation type as shown in FIG. 2. In this connection, the heating device of the light irradiation type is viewed from overhead.

As is shown in these drawings, the heating device 100' of the light irradiation type has a chamber 300', a silica glass window 4', a guard ring 5', a light source part 10' as the heating means and the like. The chamber 300' and the silica glass window 4' form a heat treatment space S2' in which there is a wafer 6'. The guard ring 5' is made of a ceramic material, such as silicon carbide or the like. In its inner edge area, the guard ring has a device 50' which holds the wafer 6' fast at the outer peripheral region of the wafer 6'. The holding device 50' for holding the wafer 6' which is located in the guard ring 5' is shown, for example, in Japanese patent disclosure document 2000-58471 and corresponding U.S. Pat. No. 6,163,648. The guard ring 5' is supported in the outer peripheral region 51' of the guard ring by a support 9' in the heat treatment space S2'. The lower end of the support 9' is in contact with the chamber 300'.

The light source part 10' is made such that several filament lamps 1A' to 1S' in the form of a rod-shaped bulb are arranged parallel to one another. For the respective filament lamp 1', normally there is one filament inside. Because the respective filament in the filament lamps 1A' to 1S' receives power supplied by the feed devices 19A-1', 19B-1', ... 19S-1' which comprise the current source part 7', radiant energy is emitted. The radiant energy emitted from the filament lamps 1A' to 1S' is delivered directly or by a reflector 2' through the silica glass window 4' into the heat treatment space S2', and heats the wafer 6' and the guard ring 5' which are located in the heat treatment space S2'.

However, the conventional heating device of the light irradiation type has the following disadvantage.

As was described above, it is necessary to heat the guard ring 5' with a greater irradiance than the wafer 6', in order to make the temperature of the wafer 6' uniform in the heat treatment of the wafer 6'. However, for the heating device 100' of the light irradiation type, as shown in FIG. 3, the filaments of the filament lamps 1' to 1Q' which are arranged with respect to the wafer 6' are arranged spanning both the wafer 6' and also the guard ring 5'.

On the other hand, as was described above, there is one filament in each of the respective filament lamps 1A' to 1S'. The irradiances which are radiated by the filaments to which power was supplied onto the guard ring 5' and the wafer 6' are therefore identical to one another. In the case of heating the wafer 6' with a given temperature, therefore also the guard ring 5' is heated with the same irradiance as that of the wafer 6'. This means that using a conventional heating device of the light irradiation type, adjustment and heating cannot be achieved such that the irradiance on the surface of the guard ring 5' is greater than the irradiance on the surface of the wafer 6'.

A process for eliminating the above described disadvantage has been proposed in Japanese patent application 2005-191222 and corresponding commonly-owned, co-pending U.S. Patent Application Publication 2006-0197454 of which the present inventors are co-inventors. FIG. 4 schematically shows the positional relationship between the filament lamps, the wafer constituting the article to be treated, and the guard ring in a heating device of the light irradiation type which was described in this application. In this connection, the heating device of the light irradiation type is viewed from overhead.

This heating device of the light irradiation type, beside the filament lamp formed by the light sources, and besides the current source parts, has the same arrangement as the heating device of the light irradiation type shown in FIG. 2. In the light source part 10' filament lamps in the form of rod-shaped tubes are arranged parallel to one another such that the distance between the respective central axes is the same. The respective filament lamp proposed in this prior application is characterized in that there are several filaments in the bulb which can be supplied individually. The specific arrangement of the filament lamps is shown in FIG. 13.

In FIG. 4, the filament lamps 1A', 1B' . . . 1S' are arranged in the same manner as in the heating device of the light irradiation type shown in FIG. 2 in the space above the wafer 6' and the guard ring 5'. The number and length of several filaments which are located in the respective filament lamps 1A', 1B', . . . 1S' are fixed in this connection according to the shape of the wafer 6' and of the guard ring 5'.

The number of filaments in the respective filament lamps 1A', 1B', . . . 1S' is fixed as follows. In the filament lamps 1F' and 1N' which belong to the filament lamp group U1' which is located in the center region of the light source part 10', there are five filaments arranged such that there is one filament corresponding to the wafer 6', two filaments corresponding to the inner peripheral region 52' of the guard ring and two filaments corresponding to the outer peripheral region 51' of the guard ring.

Furthermore, in the filament lamps 1C' to 1E' and 1O' to 1Q' which belong to the filament lamp groups U2' which are located on the two outer sides of the filament lamp group U1', three filaments at a time are arranged such that there is one filament corresponding to the inner peripheral region 52' of the guard ring and two filaments corresponding to the outer peripheral region 51' of the guard ring.

In the filament lamps 1A', 1B', 1R', 1S' which belong to the filament lamp groups U3' which are located on the two outer sides of the filament lamp groups U2', there is one filament according to the outer peripheral region 51' of the guard ring.

The length of several filaments for the respective filament lamps 1A', 1B', . . . 1S' is established as follows.

In the filament lamps 1F' to 1N' which belong to the filament lamp group U1', the respective length of the respective filaments 1F-3' to 1N-3' which are located over the wafer 6' is established such that the contour formed by the connection of their ends assumes a shape similar to the outer periphery of the wafer 6'.

Furthermore, the length of the respective filaments 1C-2' to 1Q-2' and 1F-4' to 1N-4' which are located in the filament lamps 1C' to 1Q' which belong to the filament lamp groups U1', U2' over the inner peripheral region 52' of the guard ring is established such that the contour formed by the connection of their ends assumes a shape similar to the outer periphery of the inner peripheral region 52' of the guard ring and the outer periphery of the wafer 6'.

Furthermore, the length of the respective filaments 1A-1' to 1S-1', 1C-3' to 1E-3', 1O-3' to 1Q-3' and 1F-5' to 1N-5' which are located in the filament lamps 1A' to 1S' which belong to the filament lamp groups U1', U2', U3' over the outer peripheral region 51' of the guard ring is established such that the contour formed by the connection of their ends assumes a shape similar to the outer periphery of the outer peripheral region 51' of the guard ring and the outer periphery of the inner peripheral region 52" of the guard ring.

The filament lamps 1A', 1B', . . . 1S' shown in FIG. 4 have several filaments which can be supplied individually. The number and length of the above described several filaments are fixed each according to the shape of the wafer 6', of the inner peripheral region 52' of the guard ring and the outer peripheral region 51' of the guard ring.

Therefore, it is possible to fix the radiant energy from the respective filament which is located over the guard ring 5' to be greater than the radiant energy from the respective filament which is located over the wafer 6'. Furthermore, it is possible to fix the radiant energy from the respective filament which is located over the outer peripheral region 51' of the guard ring to be greater than the radiant energy from the respective filament which is located over the inner peripheral region 52' of the guard ring.

This makes it possible to establish a distribution of the illuminance which is near the ideal distribution of the illuminance shown in FIG. 1(b) on the surface of the wafer and the guard ring. Thus, heating of the light irradiation type can be done such that the temperature of the wafer 6' is made uniform. However, since in the heating device of the light irradiation type shown in FIG. 4 several filaments which are located in the filament lamps 1A', 1B', . . . 1S' are supplied individually, feed devices are required with a number corresponding to the number of filaments which are located in the bulbs of the filament lamps 1A, 1B', . . . 1S'. When the number of feed devices increases, the current source part becomes larger and costs are increased.

To reduce the costs of the heating device of the light irradiation type, the number of filament lamps which form the light source parts can be easily reduced. However, when simply the number of filament lamps is reduced, the distribution of the irradiance on the irradiation surface becomes nonuniform.

FIGS. 5(a) to 5(c) each schematically show the relation between the number of filament lamps and the distribution of the irradiance on the irradiation surface. It is apparent therefrom that the uniformity of the irradiance distribution on the irradiation surface for a reduced number of filament lamps as shown in FIG. 5(b) compared to FIG. 5(a) is reduced. Especially in the case of heating of the article to be treated which is a silicon wafer at a temperature of at least 1050° C. does the disadvantage of the above described formation of a defect of crystal transition occur when the irradiance for the wafer becomes nonuniform.

SUMMARY OF THE INVENTION

The invention was devised to eliminate the above described disadvantages in the prior art. Thus, a primary object of the present invention is to devise a heating device of the light irradiation type in which costs can reduced by reducing the number of filament lamps and feed parts as much as possible without adversely affecting the illuminance distribution with respect to the article to be treated.

The above described object is achieved in accordance with the invention as follows:

Approach 1: Heating device of the light irradiation type which has at least one light source part, in which several filament lamps are located parallel to one another, which comprise filament lamps in which several filaments which are located along the bulb axis are supplied with power individually, and in which at a site which is irradiated with light which is emitted from these light source parts there is an article to be treated, characterized in that in the above described light source parts the distance between several filament lamps adjacent to one another is nonuniform.

Approach 2: Heating device of the light irradiation type according to approach 1, characterized in that, for the above described light source part, the distance between the filament lamps which are adjacent to one another in a filament lamp group in a center region is greater than the distance between the filament lamps which are adjacent to one another in a filament lamp group in an outer region which is located on the outer side of the above described filament lamp group of the center region.

Approach 3: Heating device of the light irradiation type according to approach 1 or 2, characterized in that, for the above described filament lamps in which several filaments which are located along the bulb axis are supplied with power individually, the rated wattage density of the filaments located in the peripheral region of the above described article to be treated is greater than the rated wattage density of the filaments which are located in the center region of the above described article to be treated.

Approach 4: Heating device of the light irradiation type according to approach 1 or 2, characterized in that the above described light source part has a reflector which reflects the light radiated from the above described respective filament lamp onto the above described article to be treated.

Approach 5: Heating device of the light irradiation type according to approach 1 or 2, characterized in that the comparison expression D/H≦1 is satisfied when D is the distance between the above described filament lamps which are adjacent to one another and H is the distance between the filament lamps and the article to be treated.

Approach 6: Heating device of the light irradiation type according to approach 1 or 2, characterized in that a guard ring is provided in the vicinity of the article to be treated.

Action of the Invention

By the invention described in approach 1, the number of filament lamps can be reduced by optional adjustment of the number of filament lamps in the light source part and as a result the number of feed parts for supplying power to the respective filament in the respective filament lamp can be reduced, by which the current source part can be made smaller and the costs reduced. Furthermore, by suitable setting of the distance between the adjacent filament lamps, the desired distribution of the illuminance on the surface of the article to be treated which has been irradiated with light can be accomplished with high precision.

By the invention described in approach 2, the number of filament lamps in the filament lamp group in the center region of the light source part can be reduced more than in an arrangement of the filament lamps such that the distance between the filament lamps adjacent to one another is uniform. As a result, the number of feed parts for supplying power to the respective filament in the respective filament lamp can be reduced, by which the current source part can be made smaller and costs reduced. Furthermore, by suitable setting of the distance between the filament lamps adjacent to one another, in addition to reducing the number of filament lamps, the desired distribution of the illuminance on the surface of the article to be treated which has been irradiated with light can be accomplished with high precision.

The invention described in approach 3 makes it possible to carry out irradiation with light such that the irradiance in the peripheral region of the article to be treated is greater than the irradiance in the center region of the article to be treated. Therefore, the effect of temperature reduction as a result of heat radiation and the like from the side of the peripheral region of the article to be treated can be equalized.

By the invention described in approach 4, the distance and the like between the filament lamps adjacent to one another can be increased without adversely affecting the distribution of the irradiance with respect to the article to be treated, by which the number of filament lamps and number of current source parts can be reduced even more.

By the invention described in approach 5, the region in which the images of the light emitted from several filament lamps come to rest on one another is enlarged. The light radiated onto the surface of the article to be treated is brought essentially to an average value on the surface of the article to be treated, by which the uniformity of the distribution of the irradiance on the surface of the article to be treated becomes advantageous.

By the invention described in approach 6, the temperature reduction as a result of heat radiation from the side of the article to be treated or the vicinity thereof can be equalized and the temperature of the article to be treated can be kept even more uniform.

The invention is described below using several embodiments shown in the drawings.

BRIEF DESCRIPTION OF THE DRAWINGS

FIGS. 7(a) & 7(b) each show a schematic of the relation between the filament of the filament lamp and the heat radiation of the bulb;

FIG. 12 shows tables describing the adjustment values of the rated wattage density of the filament and the distance between the filament lamps which are adjacent to one another;

DETAILED DESCRIPTION OF THE INVENTION

First, the definition of the irradiance on the irradiated surface of the article to be treated is described below.

Figure 6:
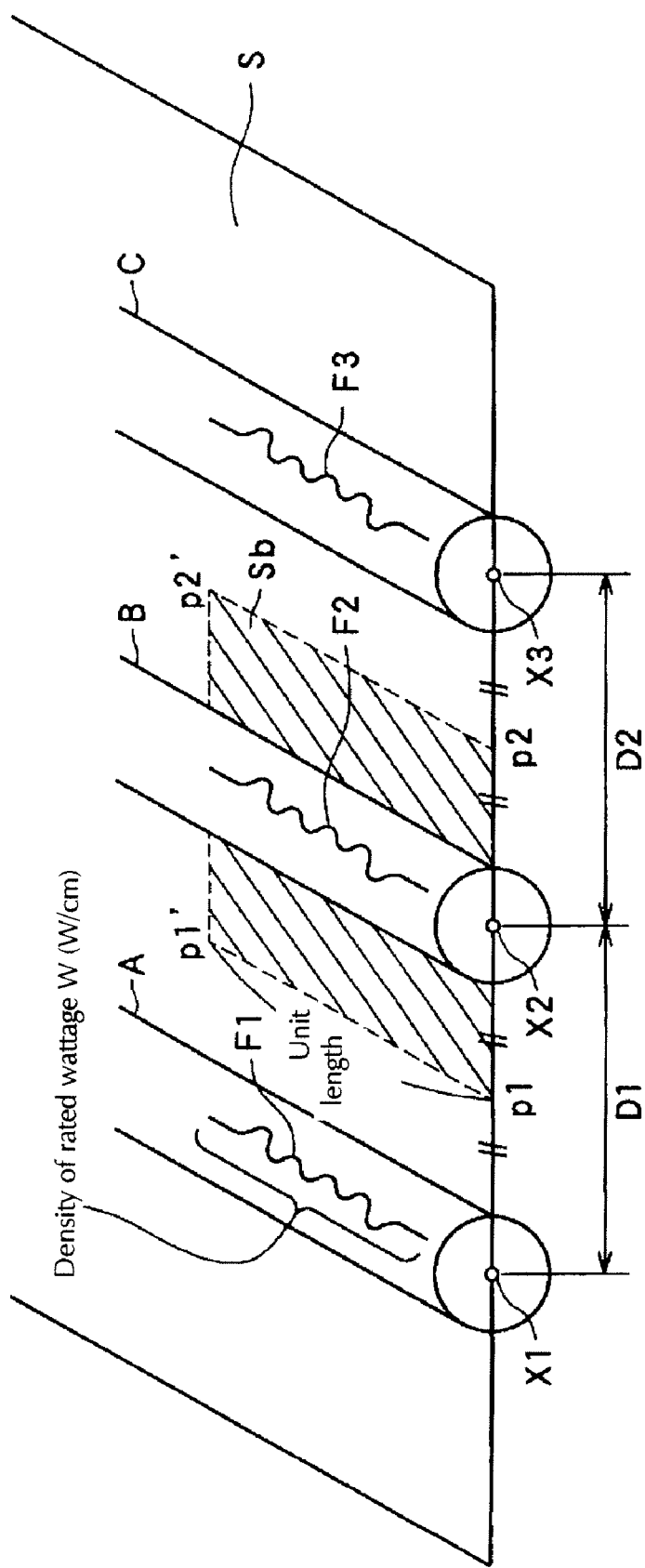
FIG. 6 is a schematic representation for illustrating what is meant by the irradiance on the irradiated surface of the article to be treated.

FIG. 6 is a schematic representation of the definition of the irradiance on the irradiated surface of the article to be treated.

First, a plane which is formed by filaments F1, F2, F3 of the filament lamps A, B and C is called the radiation surface S.

For a parallel arrangement of the filament lamps as the light source part of the heating device of the light irradiation type, depending on the accuracy of arrangement and of production of the filament lamps there is also a case in which the surface formed by the filaments F1, F2, F3 does not always correspond to a plane. In this case, a plane S' (not shown in the drawings) which is essentially parallel to the article to be treated and which is moreover located in the vicinity of the filaments F1, F2, F3 is called the radiation surface S.

The rated wattage density of the filaments F1, F2, F3 located in the bulbs of the filament lamps A, B, C is designated W (W/cm). The distance between the filament lamps A, B, C adjacent to one another is called the distance between the central axes of the filament F1, F2, F3 which are located in the filament lamps A, B, C. For example, the distance between the filament lamp A and the filament lamp B is designated the distance D1 (cm) between the central axis X1 of the filament F1 of the filament lamp A and the central axis X2 of the filament F2 of the filament lamp B. Likewise the distance between the filament lamp B and the filament lamp C is designated the distance D2 (cm) between the central axis X2 of the filament F2 of the filament lamp B and the central axis X3 of the filament F3 of the filament lamp C.

If the above described plane S' is designated the radiation surface S, based on the projection images of the respective filaments projected onto the plane S' the distance between the central axes of the filaments which are located in the respective filament lamps is designated the distance between the filament lamps which are adjacent to one another.

In this connection the radiant energy P'2 (W/cm$^2$) per unit of area·unit of time of the light radiated on the radiation surface S from the filament F2 of the filament lamp B is defined as follows:

On the radiation surface S, the radiation region on the radiation surface S to which the filament F2 contributes per unit of length is designated the region Sb, with an area computed by the product between a segment p1p2 (length: D1/2+D2/2) and the unit of length of the filament F2 (length: 1 cm) as is shown in FIG. 6, the segment p1p2 being formed by connecting the center point p1 of a segment X1 X2 and the center point p2 of a segment X2X3. Furthermore the rated wattage density W2 (W/cm) of the filament F2 corresponds to the radiant energy per unit of time of the light emitted from the filament F2 per unit of length.

The above described radiation energy P'2 is defined as follows:

$$P'2=W2/(D1/2+D2/2)$$ (Formula 1)

If it is assumed in this connection that the energy which is radiated from the unit of length of the filament F2 of the filament lamp B is uniformly irradiated from the entire region Sb, the above described radiant energy P'2 becomes the radiant energy per unit of area·unit of time in the region Sb.

The irradiance on the irradiated surface of the article to be treated depends on the difference between the radiation surface S and the irradiated surface of the article to be treated. The greater the distance between the radiation surface S and the surface to be irradiated, the more it fluctuates. In the heating device of the light irradiation type in accordance with the invention however the distance between the radiation surface S (filament of the filament lamp) and the irradiated surface of the article to be treated compared to the sizes of the article to be irradiated and the light emitting part is relatively small, i.e., it is roughly 50 mm. Therefore, it can be easily imagined that the radiant energy per unit of area·unit of time of the light radiated from the radiation surface S is essentially identical to the irradiance on the irradiated surface of the article to be treated.

The irradiance P2 on the irradiated surface of the article to be treated of the light radiated from the filament F2 of the filament lamp B (i.e., of the light irradiated from the radiation region Sb) is therefore defined under the assumption of agreement with the above described radiant energy P'2 as follows:

$$P2=W2/(D1/2+D2/2)$$ (Formula 2)

The irradiance P1 on the irradiated surface of the article to be treated of the light radiated from the filament F1 of the filament lamp A and the irradiance P3 on the irradiated surface of the article to be treated of the light radiated from the filament F3 of the filament lamp C are defined in the same way described above, formula 2.

Relative to FIG. 6, if the distance between the filament lamp A and a filament lamp (not shown) located on the left side of the filament lamp A is labeled D0 (cm) and the rated wattage density of the filament lamp F1 is labeled W1 (W/cm), the irradiance P1 on the irradiated surface of the article to be treated of the light radiated from the filament F1 of the filament lamp A is defined as follows:

$$P1=W1/(D0/2+D1/2)$$ (Formula 3)

Likewise, if relative to FIG. 6 the distance between the filament lamp C and a filament lamp (not shown) located on the right side of the filament lamp C is designated D3 (cm) and the rated wattage density of the filament F3 is designated W3 (W/cm), the irradiance P3 on the irradiated surface of the article to be treated of the light emitted from the filament F3 of the filament lamp C is defined as follows:

$$P3=W3/(D2/2+D3/2)$$ (Formula 4)

As a summary of the above described circumstances, therefore the irradiance P on the irradiated surface of the article to be treated by the light emitted from the filament F of the filament lamp is defined as follows, formula 5, when the rated power density of the filament F is designated W (W/cm) and the distance between the filament lamp and the filament lamps which are adjacent to either side of this filament lamp is designated D, D'.

$$P=W/(D/2+D'/2)$$ (Formula 5)

This means that the distribution of the irradiance on the surface of the article to be treated can be set based on the above described formula 5 by suitable adjustment of the rated wattage density of the respective filament and the distance between the respective filament lamps.

In this connection, the heating device of the light irradiation type in accordance with the invention has at least one light source part in which filament lamps are arranged parallel to one another, in which in one bulb at a time there are several filaments which can be supplied individually, as is described below using FIG. 13. The number and length of several filaments which are located in the respective filament lamps can be set according to the shapes of the wafer and guard ring, as is shown for example in FIG. 4.

Compared to a conventional heating device of light irradiation type, it becomes possible to establish the distribution of the irradiance on the surface of the article to be treated with high precision. Therefore, it becomes possible to establish a distribution of the illuminance which is near the ideal distribution of the illuminance shown in FIG. 1(a) & 1(b) with high precision.

Figure 1A:
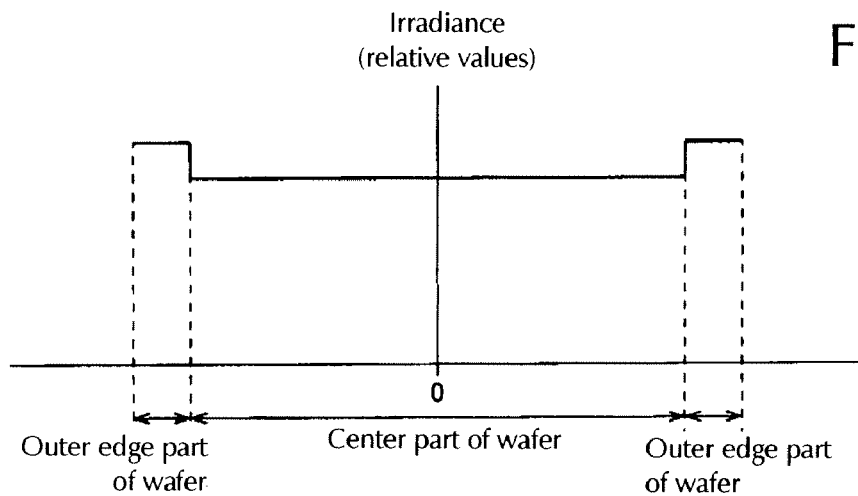
FIGS. 1(a) & 1(b) each show a schematic of an ideal distribution of the irradiance for making the wafer temperature uniform in light irradiation.

If there is no guard ring, as is shown in FIG. 1(a), it becomes possible to fix the irradiance on the surface of the outer peripheral region of the wafer to be larger than the irradiance on the surface of the center region of the wafer.

If there is a guard ring, it becomes possible to fix the irradiance on the surface of the guard ring to be larger than the irradiance on the wafer surface. It furthermore becomes possible if necessary to effect settings such that the irradiance on the surface of the outer peripheral region of the guard ring is greater than the irradiance on the surface of the guard ring except for the above described outer peripheral region.

Figure 1B:
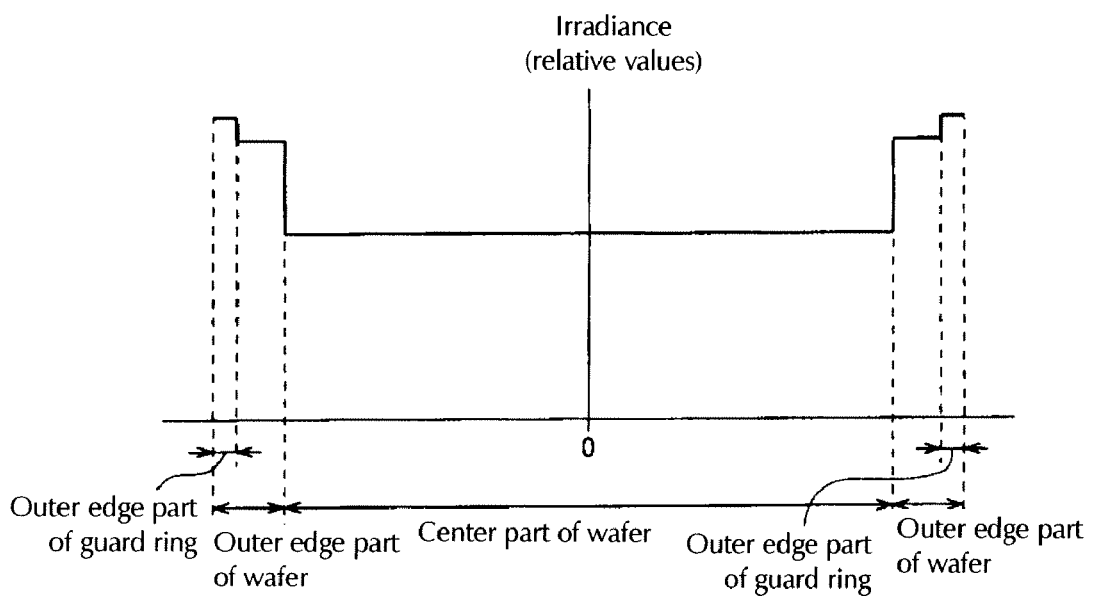

In the direction of the central axis of the filament lamp, the irradiance distribution shown in FIG. 1(b) can be easily fixed by the respective adjustment of only the rated wattage density of the filaments which are located over the wafer, over the guard ring region except for the outer peripheral region, and over the outer peripheral region of the guard ring, since in formula 5 the distances D, D' are constant between the filament lamp and the filament lamps which are adjacent on either side of the filament lamp.

In the direction which orthogonally intersects the central axis of the filament lamp, based on formula 5 the above described desired irradiance can be fixed by the respective adjustment of the rated power densities and distances D, D' of the filaments which are located over the wafer, over the guard ring region except for the outer peripheral region, and over the outer peripheral region of the guard ring.

In this connection, a reduction in the number of filament lamps is enabled by increasing the distances D, D' between the filament lamps adjacent to one another while maintaining the conditions satisfying formula 5 and moreover increasing the rated wattage density W of the filaments of these filament lamps within the ranges of rated power densities of producible filaments.

A simple reduction in the number of filament lamps in the filament lamp groups on the side of the outer peripheral region of the wafer and over the guard ring, i.e. in the filament lamp groups on the sides which are located on the outer sides of the filament lamp group in the center region of the light source part is however difficult for the following reasons.

If the number of filament lamps is reduced, the values of distances D, D' of the filament lamps is increased using formula 5. To maintain the desired irradiance P, as can be taken from formula 5, it is therefore necessary to increase the rated wattage density W of the filament. In particular, in the case of a filament which corresponds to the guard ring which requires high irradiance, when the number of filament lamps is reduced it is necessary to somewhat increase the value of the rated wattage density W.

On the other hand, the length of the filament which runs transversely over the guard ring in the filament lamp which belongs to the filament lamp group (for example, U3' in FIG. 4) on the edge of the light source part is greater than the length of the filament which runs transversely over the guard ring in the filament lamp which belongs to the filament lamp group (for example, U1' in FIG. 4) in the center region of the light source part.

The relation between the filament and the heat radiation of the bulb for the filament lamp is described below.

FIGS. 7(a) & 7(b) each show the relation between the filament and the heat radiation of the bulb. FIG. 7(a) shows the case of a great length of the filament, while FIG. 7(b) shows the case of a small length of the filament.

The light radiated in the center region of the filament heats mainly the center region of the bulb, the heat in the center region of the bulb being radiated via heat conduction from the vicinity of the two ends of the bulb. In FIG. 7(a) the temperature of the bulb wall in the immediate vicinity of the center region Fc1 of the filament is Tc1, when the distance between the center region Fc1 of the filament and the end Fe1 of the filament is labeled d1. This heat is conducted by the distance d1 in the bulb material and is radiated from the remote end Fe1 of the bulb. Heat is likewise radiated from the other end of the bulb.

On the other hand, the temperature of the bulb wall in the immediate vicinity of the center region Fc2 of the filament is Tc2, when in FIG. 7(b) the distance between the center region Fc2 of the filament and the end Fe2 of the filament is labeled d2. This heat is conducted by the distance d2 in the bulb material and radiated from the remote end Fe2 of the bulb. Heat is likewise radiated from the other end of the bulb.

As is apparent from FIGS. 7(a) & 7(b), the distance d1>distance d2. In the case as shown in FIG. 7(a), the heat of the bulb in the immediate vicinity of the center region Fc1 of the filament dissipates by heat transfer less often than in the case as shown in FIG. 7(b), by which Tc1>Tc2. This means that for the filament lamp the temperature of the wall of the bulb which corresponds to the center region of the filament in the case as shown in FIG. 7(a) is higher than in the case according to FIG. 7(b).

The temperature of the wall of the bulb which corresponds to the center region of the filament which runs crosswise over the guard ring in the filament lamp which belongs to a filament lamp group (for example, U3' in FIG. 4) on the edge of the light source part is therefore higher than the temperature of the wall of the bulb which corresponds to the center region of the filament which runs crosswise over the guard ring in the filament lamp which belongs to a filament lamp group (for example, U1' in FIG. 4) in the center region of the light source part.

Under these circumstances, for the filament lamp groups on the edges of the light source part, if the number of filament lamps is reduced and the rated wattage density of the filament is increased such that the above described formula 5 is satisfied, the temperature of the wall of the bulb which corresponds to the center region of the filament which runs crosswise over the guard ring in the filament lamp which belongs to a filament lamp group (for example, U3' in FIG. 4) on the edge of the light source part becomes very high, by which the disadvantages of thermal deformation of the silica glass comprising the bulb and devitrification (opacification) by recrystallization occur.

Since the rated wattage density of the filament can be set to the degree to which this heat problem does not arise, and since based on this value the distance between the filament lamps adjacent to one another can be obtained and determined, for the filament lamp groups on the sides of the light source part the ratio of the reduction of the number of filament lamps becomes smaller than for the filament lamp groups in the center region of the light source part.

For the filament lamp group in the center region of the light source part in which the length of the filament which runs crosswise over the center region of the wafer is relatively great, the value of the rated wattage density of the filament in which the above described disadvantage of the bulb due to heat occurs therefore has latitude. Therefore, by increasing the distances D, D' between the filament lamps adjacent to one another the number of filament lamps is reduced and the rated wattage density W of the filaments for the filament lamps in the filament lamp group is increased.

On the other hand, for the filament lamp groups on the sides on the outer sides of the filament lamp group in the center region of the light source part the rated wattage density W of the filaments of the filament lamps which belong to these filament lamp groups is fixed to the degree to which the above described disadvantage due to heat does not occur, and accordingly the distances D, D' between the filament lamps which are adjacent to one another is determined, and the filament lamps are arranged thusly.

As a result, in the light source part the distance between the filament lamps adjacent to one another in the filament lamp group in the center region is greater than the distance between the filament lamps adjacent to one another in the filament lamp groups on the sides on the outer sides of this filament lamp group in the center region.

Figure 4:
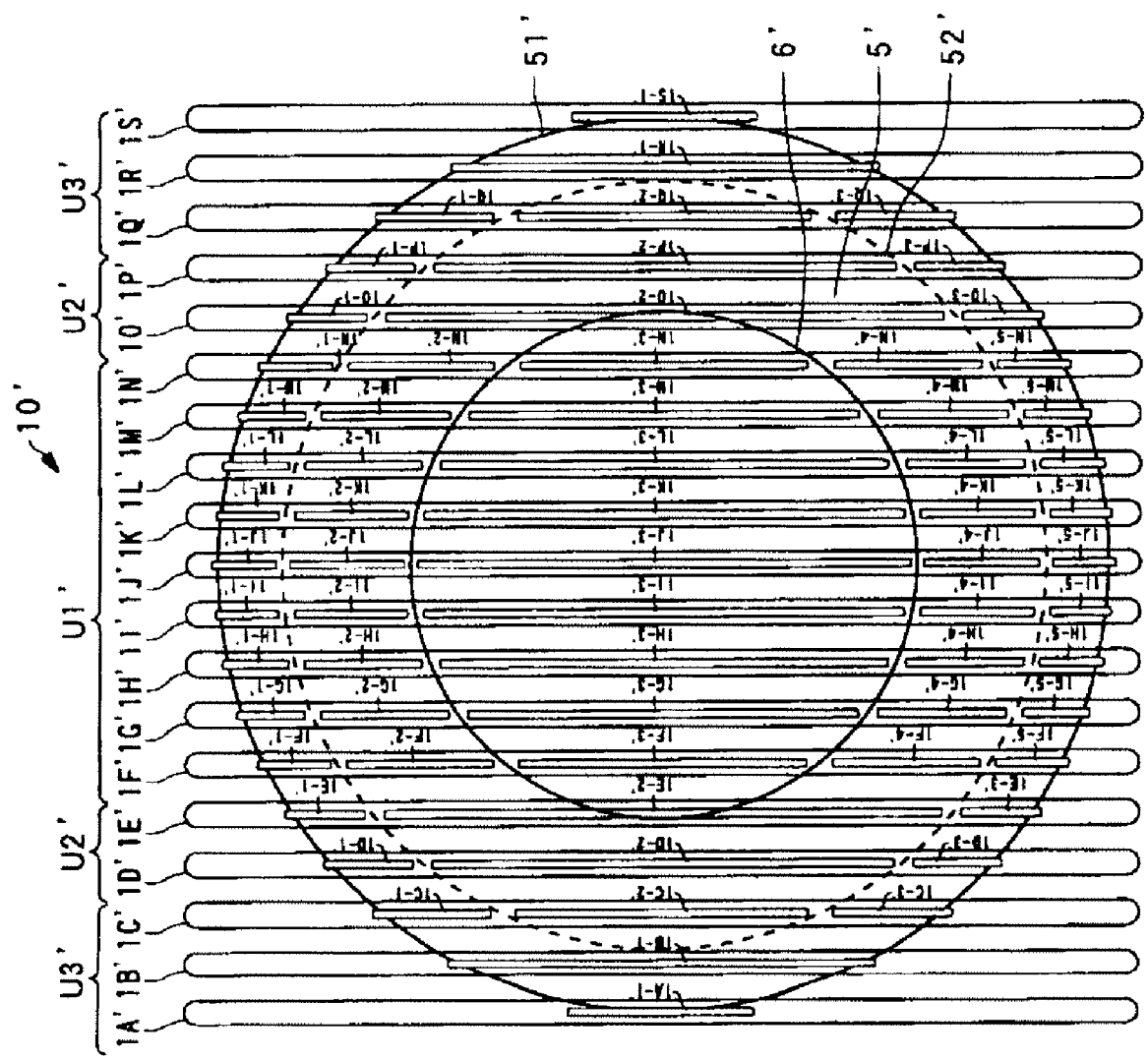
FIG. 4 shows a schematic of the positional relationships of the filament lamps, of the wafer and of the guard ring to one another for a known heating device of the light irradiation type.

As was described above, formula 5 shows the irradiance P on the irradiated surface of the light radiated from the filament of the filament lamp. If in this connection light is uniformly radiated onto the above described radiation surface S from the region to which the above described filament contributes (region Sb in the case of filament F2 as shown in FIG. 6), by suitable adjustment of the rated wattage density of the filament of the respective filament lamp of the light source part and of the distance between the respective filament lamps such that the formula 5 is satisfied, the distribution of the irradiance on the surface of the article to be treated which has been irradiated with light can theoretically be made uniform. It therefore becomes possible for example to set the distribution of the illuminance uniformly, as is shown in FIG. 1(b), on the entire surface of the wafer 6' as shown in FIG. 4.

However, in practice, light is not radiated uniformly from the region to which the above described filament contributes on the radiation surface S. If simply based on formula 5, the upper boundary value of the rated wattage density W at which the above described disadvantage due to heat does not occur is substituted and the distance between the respective filament lamps is fixed, there is therefore also the case in which the deviation of the distribution of the illuminance on the surface of the article to be treated which has been irradiated with light exceeds the allowable range. In this case it is therefore desirable to set the distance between the respective filament lamps and the rated wattage density W based on formula 5 to be so small that the above described deviation of the distribution of the illuminance lies within an allowable range.

The invention is described below using the embodiment shown in FIG. 8 to FIGS. 14(a) & 14(b).

Figure 8:
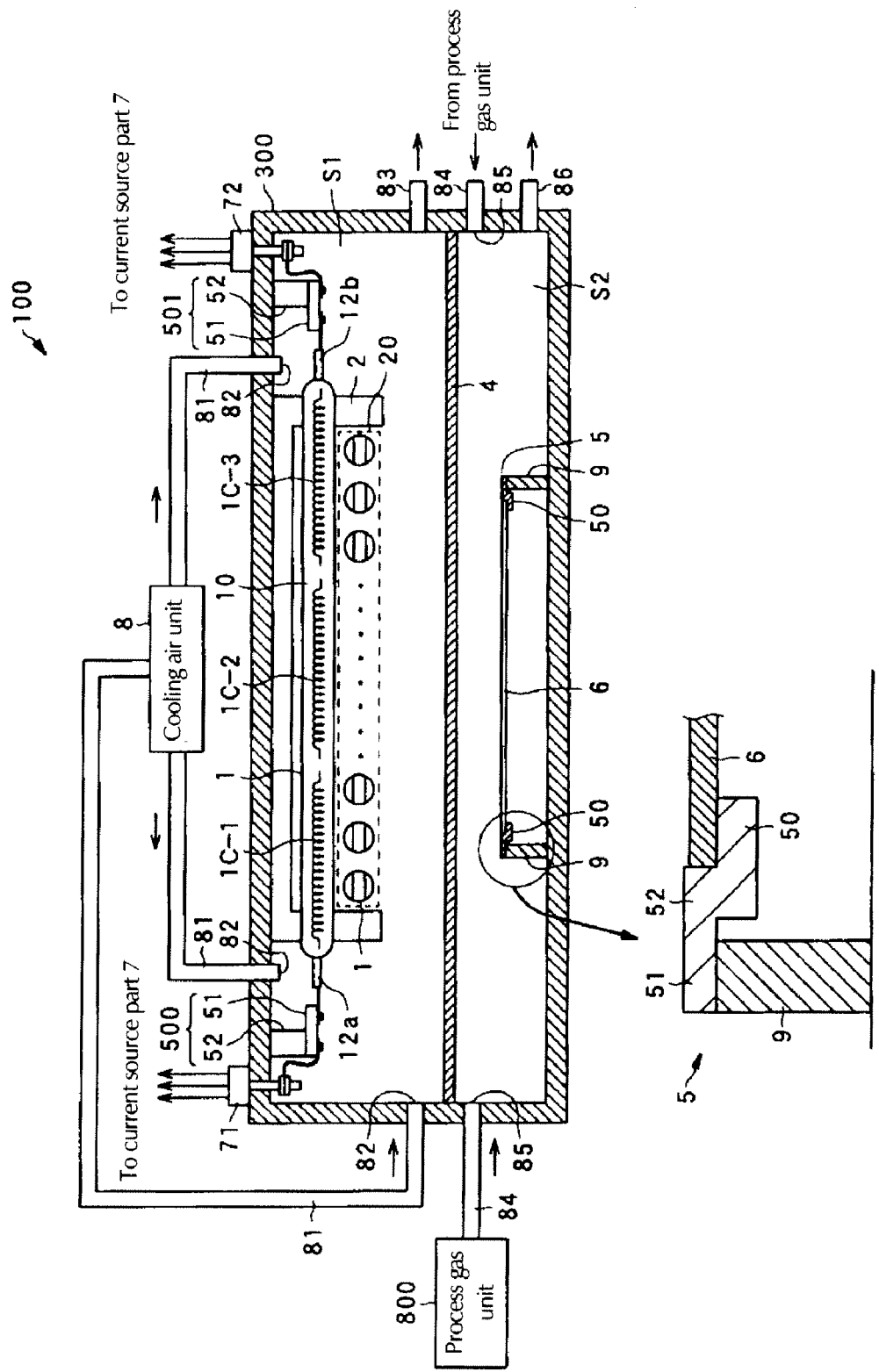
FIG. 8 is a schematic illustration of the arrangement of a heating device of the light irradiation type in accordance with the invention.
Figure 9:
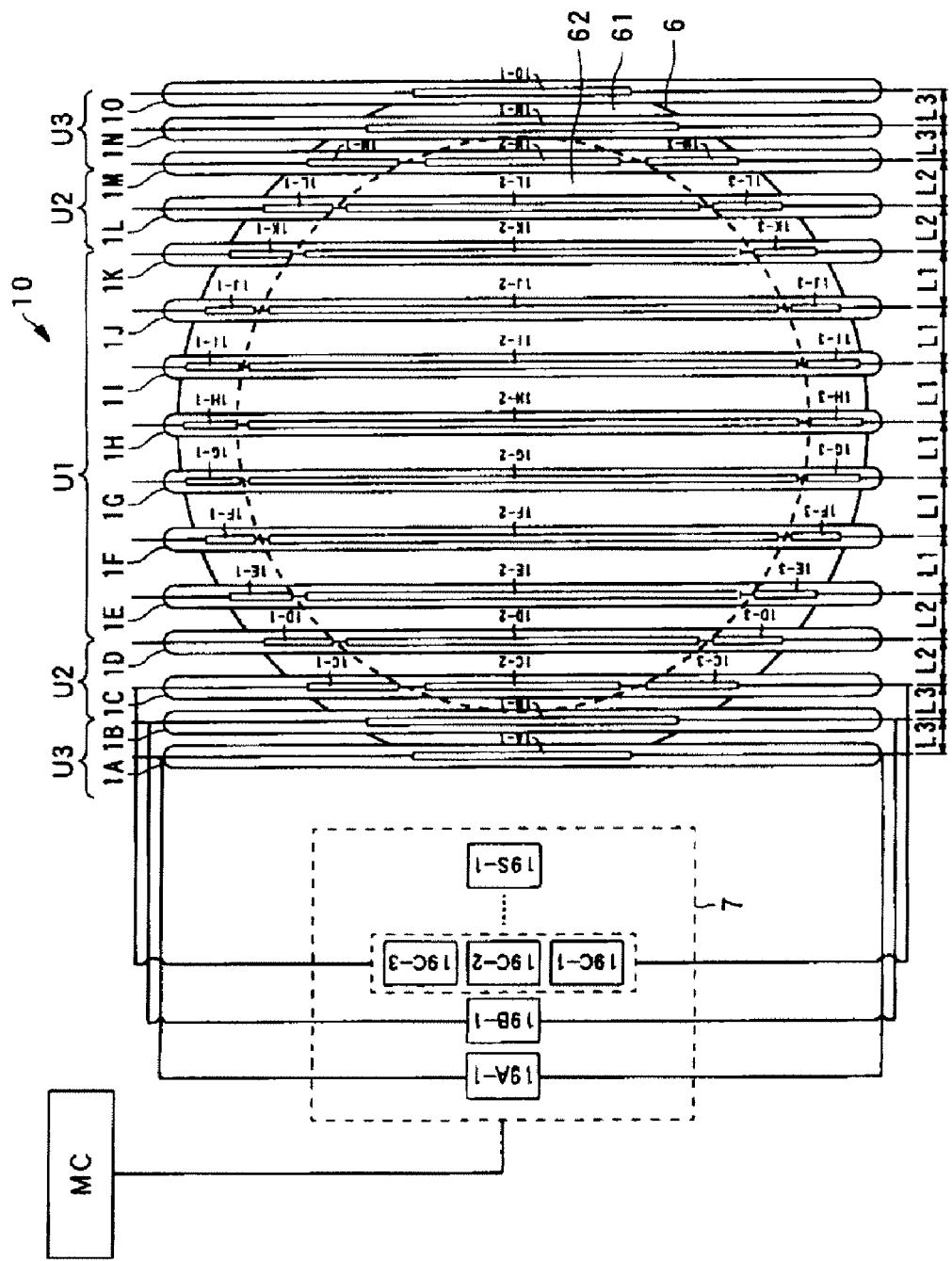
FIG. 9 is a schematic representation of the relation between the filament lamp, the wafer and the current source part in a first embodiment of the heating device of the light irradiation type in accordance with the invention.
Figure 10:
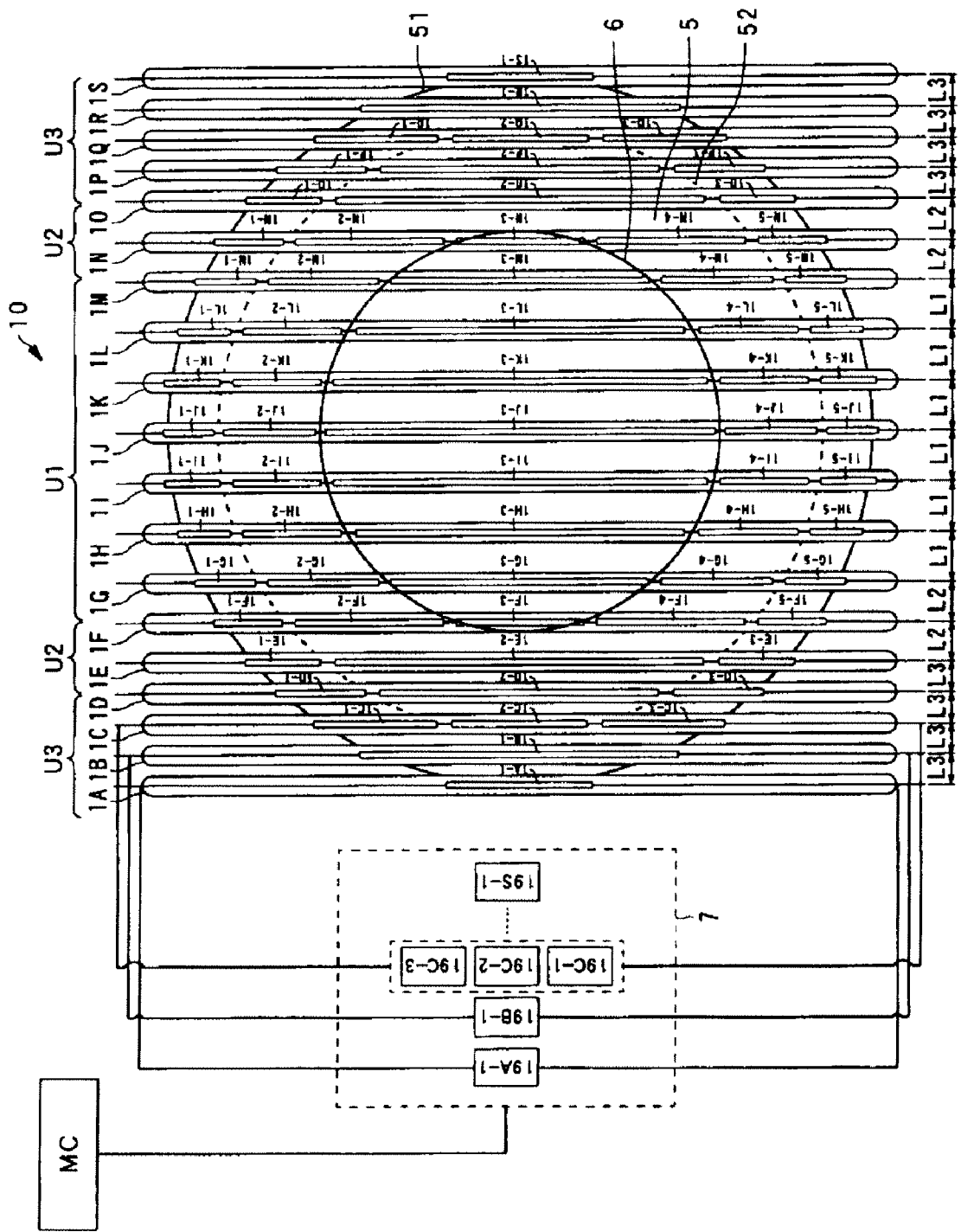
FIG. 10 depicts the relationship between the filament lamp, the wafer, the guard ring and the current source part in a second embodiment of the heating device of the light irradiation type in accordance with the invention.
Figure 11:
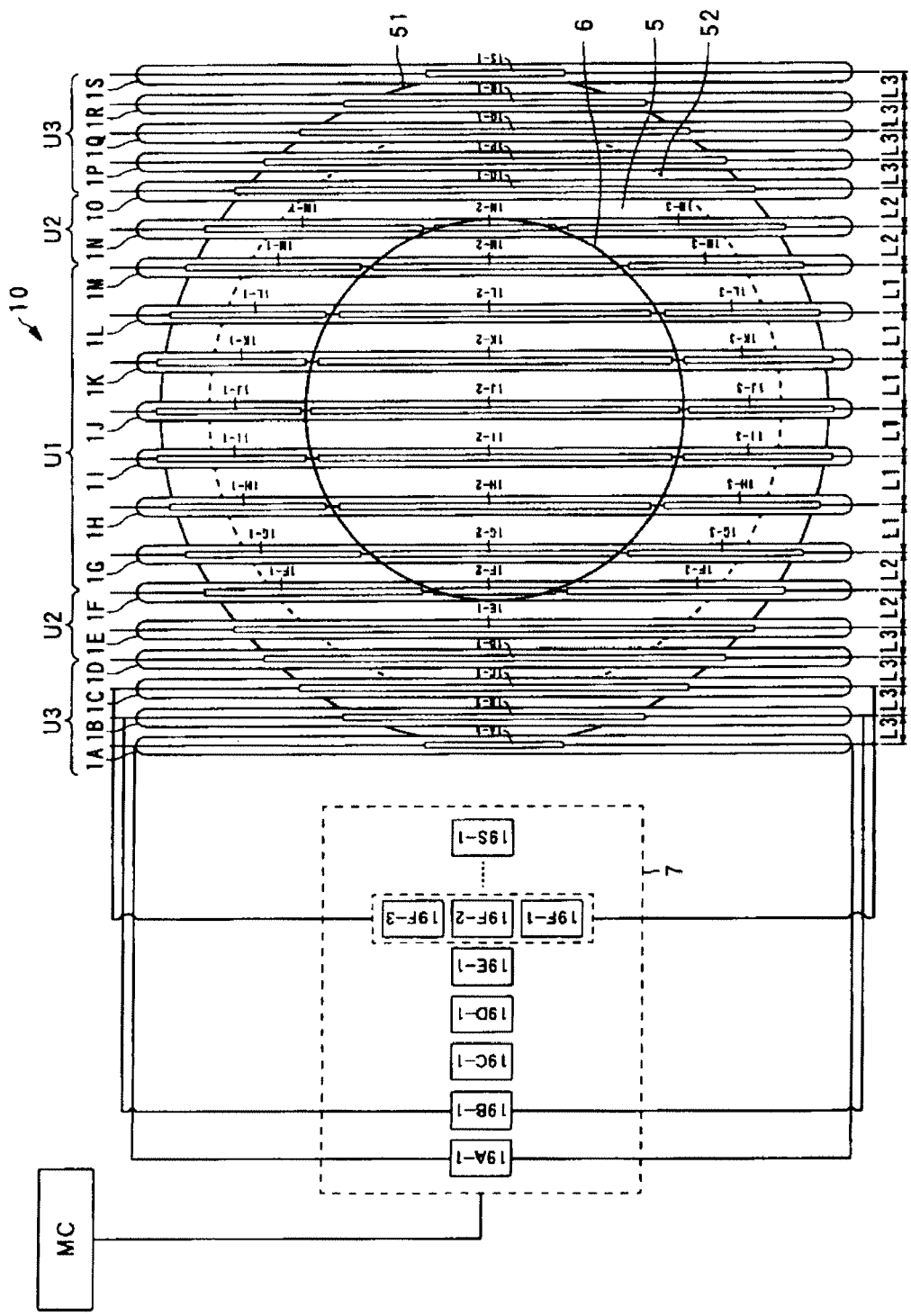
FIG. 11 depicts the relationship between the filament lamps, the wafer, the guard ring and the current source part in a third embodiment of the heating device of the light irradiation type in accordance with the invention.

FIG. 8 is a schematic of the arrangement of this embodiment of the heating device of the light irradiation type in accordance with the invention. FIG. 9 to FIG. 11 are schematics of the relation between the filament lamp, the wafer, the guard ring and the current source part, the heating device of the light irradiation type shown in FIG. 8 having been viewed from above.

As is shown in FIG. 8, this heating device of the light irradiation type 100 has a chamber 300 which is divided by a silica glass window 4 into a light source part holding space S1 and a heat treatment space S2. The wafer 6 is heat treated by irradiating the wafer 6 which is the article to be treated which is located in the heat treatment space S2 via the silica glass window 4 with light which is emitted from a first light source part 10 and a second light source part 20 which are held in the light source part holding space S1.

For the first light source part 10 and a second light source part 20 which are held in the light source part holding space S1, a defined number of filament lamps in the form of rod-shaped bulbs are arranged parallel to one another with a given distance, the two light source parts 10 and 20 come to rest on top of one another. As is shown in FIG. 8, the axial direction of the filament lamps 1 in the form of rod-shaped bulbs of the first light source part 10 crosses the axial direction of the filament lamps 1 in the form of rod-shaped bulbs of the second light source part 20. The second light source part 20 is advantageously not shown in FIG. 9 to FIG. 11 which are described below.

In the heat treatment space S2, if necessary there is a guard ring 5 on which the wafer 6 is mounted. The guard ring 5 is an annular body in the form of a thin plate of ceramic material, such as for example silicon carbide (SiC) or the like. The inner edge region thereof is provided with a step 50 for securely holding the outer peripheral region of the wafer 6, by which the wafer 6 is supported. The outer peripheral region of the guard ring 5 is provided with a support 9 for supporting the guard ring 5. When there is no guard ring 5, the support 9 is located directly in the outer peripheral region of the wafer 6.

The relation between the filament lamp 1, the wafer 6, the guard ring 5 and the current source part 7 is described below using FIG. 9 to FIG. 11.

FIG. 9 is a schematic of the relation between the filament lamps 1A to 1O, the wafer 6 and the current source part 7 according to a first embodiment of the heating device of the light irradiation type, there being no guard ring.

The dimensions of the wafer are larger than in FIGS. 10 & 11. In FIG. 9, the outside diameter of the wafer is 300 mm. In FIGS. 10 & 11, the outside diameter of the wafer is 200 mm.

As is shown in FIG. 9, one filament lamp group U1 in the center region of the first light source part 10 consists of seven filament lamps 1E to 1K. On the two sides of the filament lamp group U1 there are a total of four filament lamps 1C, 1D, 1L, and 1M, by which one filament lamp group U2 is formed, on both sides of which there are a total of four filament lamps 1A, 1B, 1N and 1O, forming a filament lamp group U3. This means that the light source part 10 is composed of fifteen filament lamps.

In the filament lamp groups U1, U2, U3, the distances L1, L2, L3 between the filament lamps adjacent to one another are 24 mm, 20 mm and 16 mm, respectively. I.e., the distance L1 between the filament lamps adjacent to one another in the filament lamp group U1 in the center region of the light source part is greater than the distances L2, L3 between the filament lamps adjacent to one another in the filament lamp groups U2, U3 on the sides on the two outer sides of this filament lamp group in the center region.

For the filament lamps 1C to 1M in the filament lamp described below using FIG. 13, in one bulb there are three filaments. For the filament lamps 1A, 1B, 1N, 1O as in the conventional filament lamp there is only one single filament in the bulb.

In FIG. 9, the filament lamps 1C to 1M are designed as follows, so that the respective length of the filaments 1C-2 to 1M-2 corresponds to the shape of the wafer 6. For the filaments 1C-2 to 1M-2 which are located in the center region 62 of the wafer and which are shown using the broken lines, their length is defined such that the contour formed by a connection of the ends is similar to the shape of the outer periphery of the center region 62. For the filaments 1A-1 to 1O-1 and 1C-3 to 1M-3 which are located in the outer peripheral region 61 of the wafer and are shown using solid lines, their length is defined such that the contour formed by a connection of the ends is similar to the shape of the outer periphery of the outer peripheral region 61 of the wafer and the shape of the outer periphery of the center region 62 of the wafer.

As is shown in FIG. 9, the filament lamps 1A and 1B are electrically connected to the feed devices 19A-1, 19B-1. For the filament lamp 1C one feed device 19C-1 is connected to one filament 1C-1, one feed device 19C-2 is connected to one filament 1C-2, and one feed device 19C-3 is connected to one filament 1C-3. For the filament lamps 1D to 1O one feed device is likewise connected to one filament at a time. For the filament lamps of the light source part 20 as in the light source part 10 one feed device is connected to one filament at a time; but this is advantageously not shown in the drawings.

Several feed devices are generally altogether also called the current source 7. In FIG. 9 the current source part 7 in the light source part 10 and the light source part 20 has 74 feed devices.

FIG. 10 is a schematic of the relation between the filament lamps 1A to 1S, the wafer 6 and the guard ring 5 according to a second embodiment of the heating device of the light irradiation type. In this connection, there is guard ring 5 in which there is a filament to cover the heat radiation from the outer peripheral region 51 of the guard ring.

As is shown in FIG. 10, the filament lamp group U1 in the center region of the first light source part 10 consists of seven filament lamps 1G to 1M. On the two sides of the filament lamp group U1 there are a total of four filament lamps 1E, 1F, 1N, and 1O, by which a filament lamp group U2 is formed, on both sides of which there are a total of eight filament lamps 1A to 1D and 1P to 1S, forming a filament lamp group U3. This means that the light source part 10 consists of nineteen filament lamps.

In the filament lamp groups U1, U2, U3, the distances L1, L2, L3 between the filament lamps adjacent to one another are 24 mm, 20 mm and 16 mm, respectively. I.e., the distance L1 between the filament lamps adjacent to one another in the filament lamp group U1 in the center region of the light source part is greater than the distances L2, L3 between the filament lamps adjacent to one another in the filament lamp groups U2, U3 on the sides on the two outer sides of the filament lamp group in the center region.

For the filament lamps 1F to 1N, for the same filament lamps as the filament lamp described below using FIG. 13, in a bulb there are five filaments. For the filament lamps 1C to 1E and 1O to 1Q, in the bulb of the filament lamp shown in FIG. 13 there are three filaments. In the filament lamps 1A, 1B, 1R, 1S, as in a conventional filament lamp, there is only a single filament in the bulb.

In FIG. 10, the filament lamps 1A to 1S are designed as follows so that the length of the respective filament corresponds to the shapes of the wafer 6 and the guard ring 5. For the filaments 1F-3 to 1N-3 which are located over the wafer 6 and which are shown using solid lines, their length is chosen such that the contour formed by a connection of the ends is similar to the shape of the outer periphery of the wafer 6. For the filaments 1C-2 to 1Q-2 and 1F-4 to 1N-4 which are located over the inner peripheral region 52 of the guard ring and which are shown using broken lines, their length is fixed such that the contour formed by a connection of the ends is similar to the shape of the outer periphery of the inner peripheral region 52 of the guard ring and the shape of the outer periphery of the wafer 6. For the filaments 1A-1 to 1S-1, 1C-3 to 1E-3, 1O-3 to 1Q-3, 1F-5 to 1N-5 which are located over the outer peripheral region 51 of the guard ring and which are shown using solid lines, their length is chosen such that the contour formed by a connection of the ends is similar to the shape of the outer periphery of the outer peripheral region 51 of the guard ring and the shape of the outer periphery of the inner peripheral region 52 of the guard ring.

As is shown in FIG. 10, the filament lamps 1A and 1B are connected to the feed devices 19A-1, 19B-1. For the filament lamp 1C, one feed device 19C-1 is connected to one filament 1C-1, one feed device 19C-2 is connected to one filament 1C-2, and one feed device 19C-3 is connected to one filament 1C-3. For the filament lamps 1D to 1S one feed device is likewise connected to one filament at a time. For the filament lamps of the light source part 20, as in the light source part 10, one feed device is connected to one filament at a time; but this is not shown in the drawings for clarity of illustration. In FIG. 10, the current source part 7 in the light source part 10 and the light source part 20 has 134 feed devices.

It is ideal to connect one feed device to one filament; but this is in no way an essential condition. This means that a single feed device can also be connected to several filaments. For example, in FIG. 10 in a region provided with one filament 1J-3, instead of the filament 1J-3 there can be at least two filaments to which a single feed part can be connected. In this case it is also possible to make the irradiance with respect to the guard ring 5 greater than the irradiance with respect to the wafer 6. Therefore the distribution of the irradiance shown in FIG. 1(*b*) can be obtained.

FIG. 11 is a schematic of the relation between the filament lamps 1A to 1S, the wafer 6, the guard ring 5 and the current source part 7 according to a third embodiment of the heating device of the light irradiation type, there being a guard ring 5. The difference from FIG. 10 lies in that the guard ring 5 is not provided with a filament which is used to cover the heat radiation from the outer peripheral region 51 of the guard ring.

As is shown in FIG. 11, the filament lamp group U1 in the center region of the first light source part 10 consists of seven filament lamps 1G to 1M. On the two sides of the filament lamp group U1 there are a total of four filament lamps 1E, 1F, 1N, and 1O, by which one filament lamp group U2 is formed, on both sides of which there are a total of eight filament lamps 1A to 1D and 1P to 1S, forming a filament lamp group U3. This means that the light source part 10 is composed of nineteen filament lamps.

In the filament lamp groups U1, U2, U3, the distances L1, L2, L3 between the filament lamps adjacent to one another are 24 mm, 20 mm and 16 mm, respectively. That is, the distance L1 between the filament lamps adjacent to one another in the filament lamp group U1 in the center region of the light source part is greater than the distances L2, L3 between the filament lamps adjacent to one another in the filament lamp groups U2, U3 on the sides on the two outer sides of the filament lamp group in the center region.

For the filament lamps 1F to 1N, in the bulb of the filament lamp described below using FIG. 13, there are three filaments. For the filament lamps 1AC to 1E and 1O to 1S there is only a single filament in the bulb, as in the conventional filament lamp.

In FIG. 11, the filament lamps 1A to 1S are designed as follows so that the length of the respective filament corresponds to the shapes of the wafer 6 and the guard ring 5. For the filaments 1F-2 to 1N-2 which are located over the wafer 6 and which are shown using the solid lines, their length is chosen such that the contour formed by a connection of the ends is similar to the shape of the outer periphery of the wafer 6. For the filaments 1A-1 to 1S-1 and 1F-3 to 1N-3 which are located over the guard ring 5 and are shown using solid lines, their length is chosen such that the contour formed by a connection of the ends is similar to the shape of the outer periphery of the guard ring 5 and the shape of the outer periphery of the wafer 6.

As is shown in FIG. 11, the filament lamps 1A to 1E are electrically connected to the feed devices 19A-1 to 19E-1. For the filament lamp 1F one feed device 19F-1 is connected to one filament 1F-1, one feed device 19F-2 is connected to one filament 1F-2, and one feed device 19F-3 is connected to one filament 1F-3. For the filament lamps 1G to 1S one feed device is likewise connected to one filament at a time. For the filament lamps of the light source part 20 as in the light source part 10 one feed device is connected to one filament at a time;

but this is advantageously not shown in the drawings. In FIG. 11 the current source part 7 in the light source part 10 and the light source part 20 has 74 feed devices.

Since, in FIG. 11, the outer peripheral region 51 of the guard ring as shown in FIG. 10 is not provided with a filament to cover the amount of heat radiation from the outer peripheral region 51 of the guard ring, the temperature of the outer peripheral region 51 of the guard ring drops. Therefore, it can be imagined that the ideal distribution of the irradiance shown in FIG. 1(b) is not obtained. The temperature of the guard ring 5 need not be uniform if only the temperature of the wafer 6 is uniform. However, if the thickness of the guard ring 5 is, for example, 1 mm, there is the danger of damage to the guard ring 5 by heat stress when the temperature difference exceeds 50° C. in spots. Therefore, a region must be chosen in which this temperature difference does not arise.

In FIGS. 9 to 11, the wafer 6 is made of silicon (Si). Its outside diameter is 300 mm in FIG. 9, and 200 mm in FIGS. 10 & 11. Its thickness is 0.7 mm. In FIGS. 10 & 11, the width of the guard ring 5 is 75 mm and the thickness is 1 mm. The distance between the filament lamps 1A to 1S is 50 mm.

In the case of a temperature rise of the above described wafer and of the guard ring with a rate of temperature increase of 250° C./second the irradiance for the wafer at 80 (W/cm²) and the irradiance for the guard ring at 120 (W/cm²) can be made uniform. To cover the heat radiation from the edge area and the connection side of the support of the article to be treated (including a virtual plate body in which the wafer and the guard ring are made in one piece with one another), i.e., to cover the heat radiation from the outer peripheral region of the article to be treated, the irradiance must be roughly 1.2 times that in the center region of the article to be treated.

Tables 1 to 3 in FIG. 12 show the setting values of the rated wattage density of the filament and of the distance between the filament lamps adjacent to one another to meet the above described conditions.

In FIG. 12, Table 1 corresponds to FIG. 9 Table 2 corresponds to FIG. 10 and Table 3 corresponds to FIG. 11.

In FIG. 9, for the filament lamps 1F to 1J, the rated wattage density W of the filaments (1F-2, 1G-2 . . . . 1J-2) located directly above the center region 62 of the wafer is 190 (W/cm) and the rated wattage density W of the filaments (1F-1, 1G-1 . . . 1J-1, 1F-3, 1G-3 . . . 1J-3) located directly above the outer peripheral region 61 of the wafer is 230 (W/cm). As was described above, the distance L1 between the filament lamps adjacent to one another for the filament lamps 1F to 1J is 24 mm. The two values of D, D' in formula 5 are therefore 24 mm.

The above described formula 5 therefore yields 190/2.4=80 (W/cm²) for the irradiance P from a filament (for example, 1H-2) located directly above the center region 62 of the wafer. For the irradiance P from a filament (for example, 1H-1) located directly above the peripheral region 61 of the wafer the value is 230/2.4=96 (W/cm²).

For the filament lamps 1E, 1K the rated wattage density W of the filament (1E-2, 1K-2) located directly above the center region 62 of the wafer is 175 (W/cm) and the rated wattage density W of the filaments (1E-1, 1E-3, 1K-1, 1K-3) located directly above the peripheral region 61 of the wafer is 211 (W/cm). For the filament lamp 1E, the distance L1 to the adjacent filament lamp 1F is 24 mm and the distance L2 to the adjacent filament lamp 1D is 20 mm. For the filament lamp 1K the distance L1 to the adjacent filament lamp 1J is 24 mm and the distance L2 to the adjacent filament lamp 1L is 20 mm. In this way, the values of D, D' in formula 5 are 24 mm and 20 mm respectively.

The above described formula 5 therefore yields 175/2.2=80 (W/cm²) for the irradiance P from filaments 1E-2, 1K-2 located directly above the center region 62 of the wafer. For the irradiance P from a filament 1E-1, 1E-3, 1K-1, 1K-3 located directly above the peripheral region 61 of the wafer, the value is 211/2.2=96 (W/cm²).

Accordingly, the rated wattage density of the filaments and the distance between the filament lamps adjacent to one another were set in the same manner as described above such that the conditions shown in Table 1 in FIG. 12 are satisfied.

In FIG. 10, for the filament lamps 1H to 1L, the rated wattage density W of the filaments (1H-3, 1I-3 . . . 1L-3) located directly above the wafer 6 is 190 (W/cm), the rated wattage density W of the filaments (1H-2, 1I-2 . . . 1L-2, 1H-4, 1I-4, . . . 1L-4) located directly above the inner peripheral region 52 of the guard ring is 290 (W/cm), and the rated wattage density W of the filaments (1H-1, 1I-1 . . . 1L-1, 1H-5, 1I-5, . . . 1L-5) located directly above the outer peripheral region 51 of the guard ring is 345 (W/cm). As was described above, the two values of D, D' in formula 5 are therefore 24 mm, since for the filament lamps 1H to 1L the distance L1 between the filament lamps adjacent to one another is 24 mm.

The above described formula 5 therefore yields 190/2.4=80 (W/cm²) for the irradiance P from a filament (for example, 1H-3) located directly above the wafer 6. For the irradiance P from a filament (for example, 1H-2) located directly above the inner peripheral region 52 of the guard ring, the value is 290/2.4=120 (W/cm²). For the irradiance P from a filament (for example, 1H-1) located directly above the outer peripheral region 51 of the guard ring, the value is 345/2.4=144 (W/cm²).

For the filament lamps 1G, 1M, the rated wattage density W of the filaments (1G-3, 1M-3) located directly above the wafer 6 is 175 (W/cm), the rated wattage density W of the filaments (1G-2, 1G-4, 1M-2, 1M-4) located directly above the inner peripheral region 52 of the guard ring is 265 (W/cm), and the rated wattage density W of the filaments (1G-1, 1G-5, 1M-1, 1M-5) located directly above the outer peripheral region 51 of the guard ring is 318 (W/cm). For the filament lamp 1G, the distance L1 to the adjacent filament lamp 1H is 24 mm and the distance L2 to the adjacent filament lamp 1F is 20 mm. For the filament lamp 1M the distance L1 to the adjacent filament lamp 1L is 24 mm and the distance L2 to the adjacent filament lamp 1N is 20 mm. In this way, the values of D, D' in formula 5 are 24 mm and 20 mm respectively.

Formula 5 therefore yields 175/2.2=80 (W/cm²) for the irradiance P from filaments 1G-3, 1M-3 located directly above the wafer 6. For the irradiance P from filaments 1G-2, 1G-4, 1M-2, 1M-4 located directly above the inner peripheral region 52 of the guard ring, the value is 265/2.2=120 (W/cm²). For the irradiance P from filaments 1G-1, 1G-5, 1M-1, 1M-5 located directly above the outer peripheral region 51 of the guard ring, the value is 317/2.2=144 (W/cm²).

Accordingly, the rated wattage density of the filaments and the distance between the filament lamps adjacent to one another were set in the same manner as described above such that the conditions shown in Table 2 in FIG. 12 are satisfied.

In FIG. 11, for the filament lamps 1H to 1L, the rated wattage density W of the filaments (1H-2, 1I2 . . . 1L-2) located directly above the wafer 6 is 190 (W/cm) and the rated wattage density W of the filaments (1H-1, 1I-1 . . . 1L-1, 1H-3, 1I-3, . . . 1L-3) located directly above the guard ring 5 is 290 (W/cm). As was described above, the two values of D, D' in formula 5 are therefore 24 mm, since for the filament lamps 1H to 1L the distance L1 between the filament lamps adjacent to one another is 24 mm.

The above described formula 5 therefore yields 190/2.4=80 (W/cm²) for the irradiance P from a filament (for example, 1H-2) located directly above the wafer 6. For the irradiance P from a filament (for example, 1H-1) located directly above the guard ring 5, the value is 290/2.4=120 (W/cm²).

For the filament lamps 1G, 1M, the rated wattage density W of the filaments (1G-2, 1M-2) located directly above the wafer 6 is 175 (W/cm) and the rated wattage density W of the filaments (1G-1, 1G-3, 1M-1, 1M-3) located directly above the guard ring 5 is 265 (W/cm). For the filament lamp 1G the distance L1 to the adjacent filament lamp 1H is 24 mm and the distance L2 to the adjacent filament lamp 1F is 20 mm. For the filament lamp 1M the distance L1 to the adjacent filament lamp 1L is 24 mm and the distance L2 to the adjacent filament lamp 1N is 20 mm. In this way, the values of D, D' in formula 1 are 24 mm and 20 mm respectively.

Formula 1 therefore yields 175/2.2=80 (W/cm²) for the irradiance P from filaments 1G-2, 1M-2 located directly above the wafer 6. For the irradiance P from filaments 1G-1, 1G-3, 1M-1, 1M-3 located directly above the guard ring 5, the value is 265/2.2=120 (W/cm²).

Accordingly, the rated wattage density of the filaments and the distance between the filament lamps adjacent to one another were set in the same manner as described above such that the conditions shown in Table 3 in FIG. 12 are satisfied.

The temperature reduction in the outer peripheral region 51 of the guard ring by setting the above described conditions as shown in Table 3 in FIG. 12 compared to the inner peripheral region 52 of the guard ring is less than 50° C. The guard ring 5 is not damaged.

Figure 13:
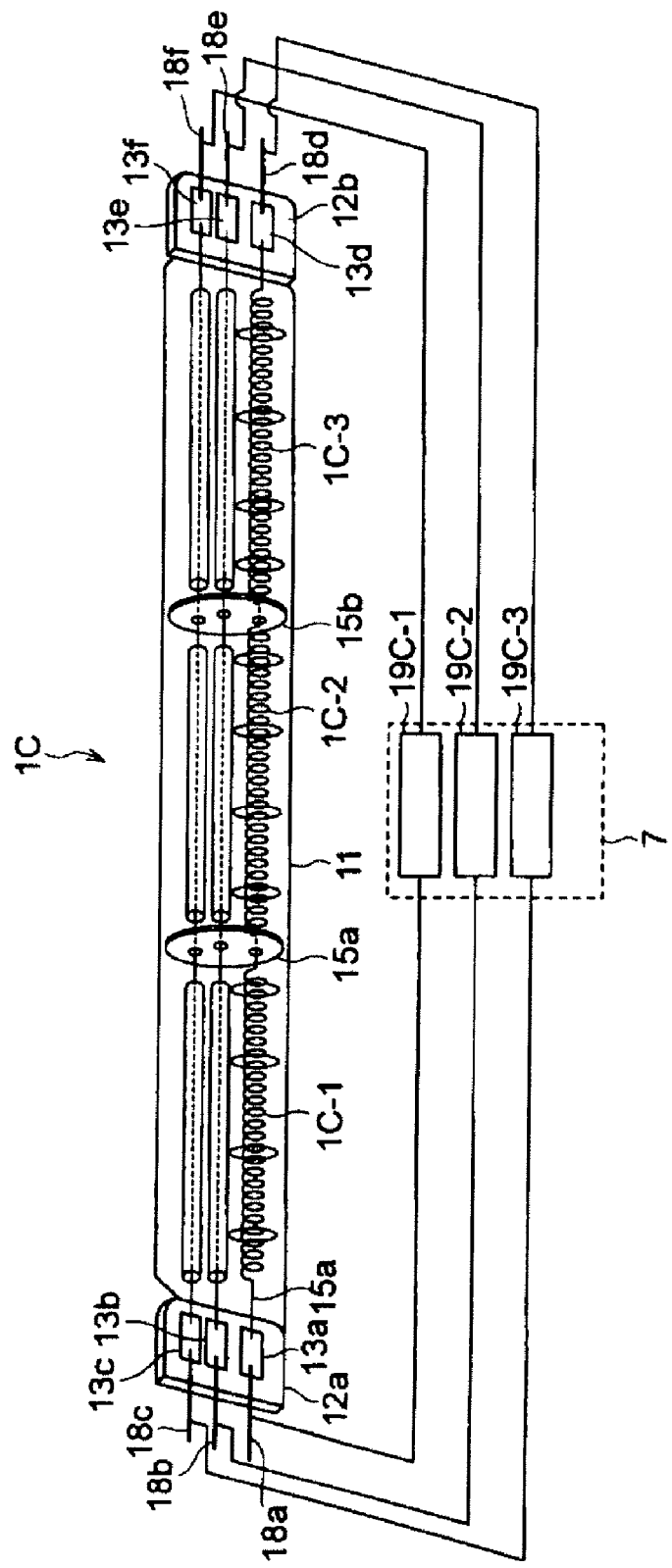
FIG. 13 shows a schematic of the specific arrangement of a filament lamp in an earlier application of the applicant.

FIG. 13 is a schematic of the specific arrangement of a filament lamp 1 which was proposed in the above-mentioned Japanese patent application 2005-191222 and corresponding commonly-owned, co-pending U.S. Patent Application Publication 2006-0197454.

The arrangement shown in FIG. 13 corresponds, for example, to the arrangement of the filament lamp 1C shown in FIG. 9. As is shown in FIG. 13, in the bulb 11 of the filament lamp 1 hermetically sealed portions 12a and 12b are formed by a pinch seal on the two ends, by which the inner side of the bulb 11 is hermetically sealed. Metal foils 13a, 13b, 13c are inserted in the hermetically sealed portion 12a by the pinch seal and metal foils 13d, 13e, 13f are inserted in the hermetically sealed portion 12b by the pinch seal. Outer leads 18a, 18b, 18c, 18d, 18e and 18f are electrically connected to the metal foils 13a, 13b, 13c, 13d, 13e and 13f respectively.

Within the bulb 11, three filaments 1C-1, 1C-2 and 1C-3 are arranged in a row essentially coaxially. Between the filaments 1C-1 and 1C-2, there is an insulator 15a. Between the filaments 1C-2 and 1C-3, there is an insulator 15b. The filament 1C-1 is electrically connected to the metal foils 13a, 13f, the filament 1C-2 is electrically connected to the metal foils 13b, 13e, and the filament 1C-3 is electrically connected to the metal foils 13c, 13d. The number of filament lamps in the example shown in FIG. 13 is 3, but if necessary can be suitably increased/decreased.

In the filament lamp 1, a first feed device 19C-1 is connected between the outer leads 18a and 18f, a second feed device 19C-2 is connected between the outer leads 18b and 18e and a third feed device 19C-3 is connected between the outer leads 18c and 18d. That is, the filament lamps 1C-1, 1C-2 and 1C-3 are each supplied independently of one another by separate feed devices 19C-1, 19C-2, and 19C-3. The feed devices 19C-1, 19C-2 and 19C-3 are variable power sources with a feed amount which can be adjusted as required.

The arrangement of this embodiment of the heating device of the light irradiation type in accordance with the invention is described using FIG. 8.

Figure 2:
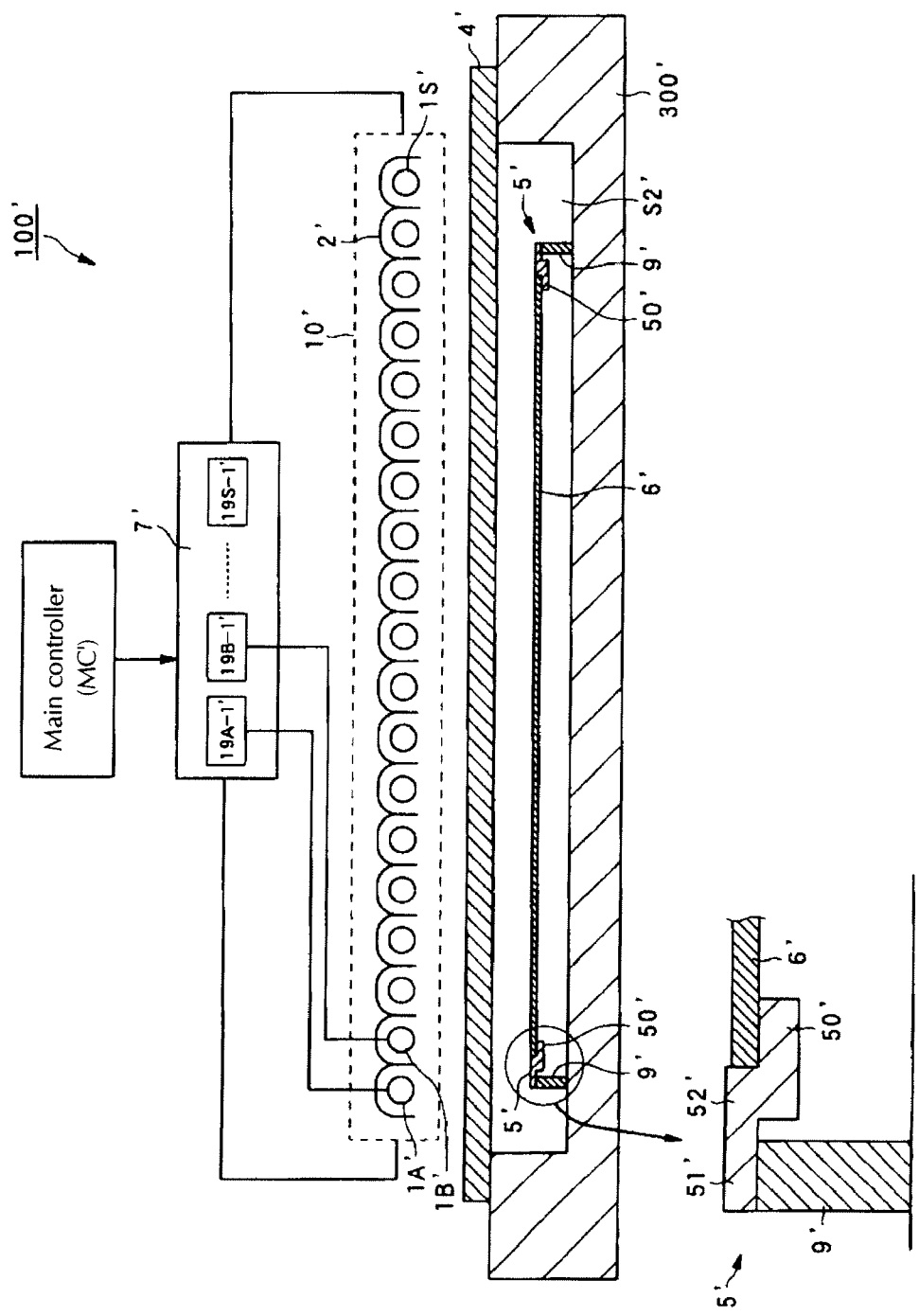
FIG. 2 shows a schematic of the arrangement of one example of a heating device of the light irradiation type for the prior art.
Figure 3:
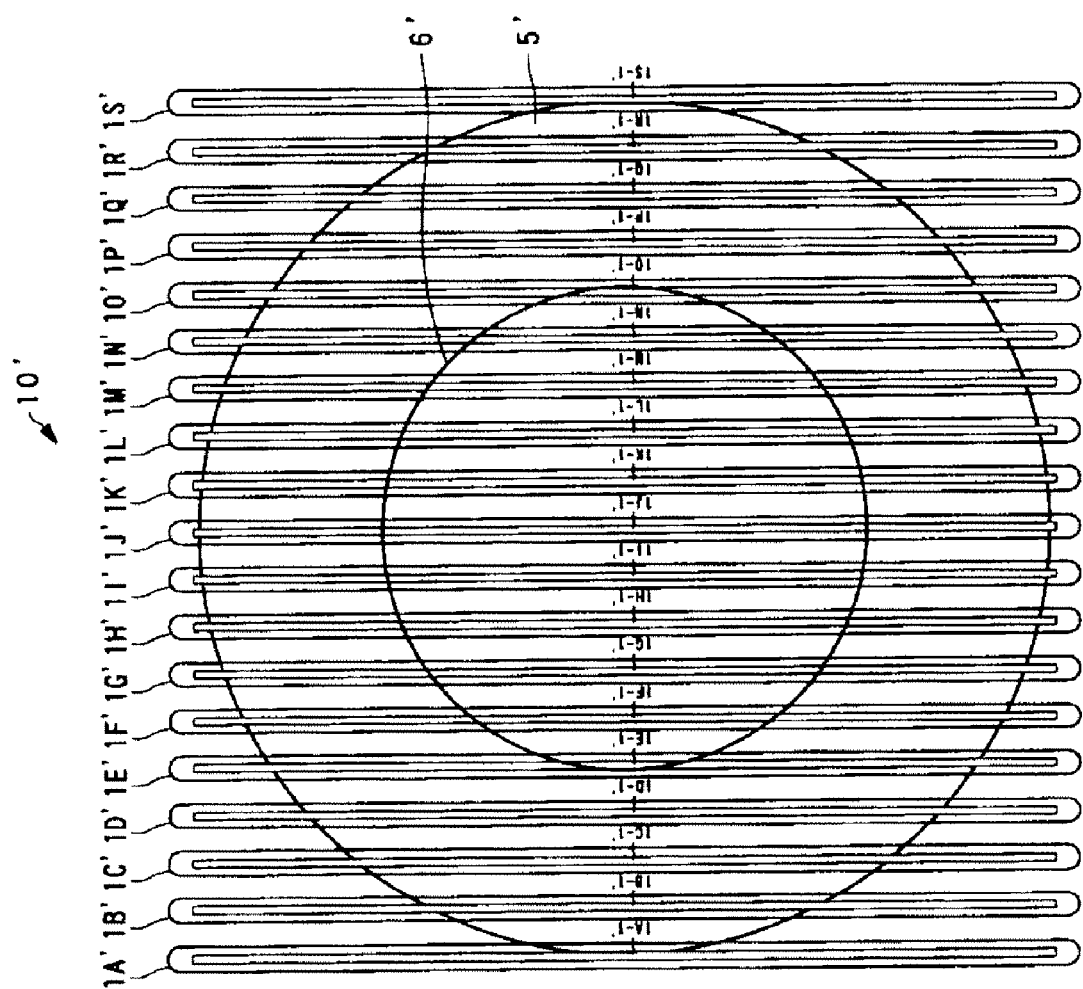
FIG. 3 shows a schematic of the positional relationships of the filament lamps, of the wafer and of the guard ring to one another for a heating device of the light irradiation type as shown in FIG. 2.

In FIG. 8, above the first light source part 10 there is a reflector 2 for reflecting the light from the filament lamp 1 of the light source parts 10 and 20 onto the side of the wafer 6. The shape of the reflector 2 can be a corrugated shape as in the reflector 2' shown in FIG. 2 or also a plate shape as shown in FIG. 8. The light from the light sources 10 and 20 is reflected from the respective filament lamps 1 in the light source parts 10 and 20 directly or from the reflector 2 and radiated via the silica glass window 4 onto the wafer 6 which is held securely by the guard ring 5. The placement of this reflector 2 can further increase the uniformity of the light radiated onto the wafer 6, even if the distance between the filament lamps 1 is great.

Figure 5A:
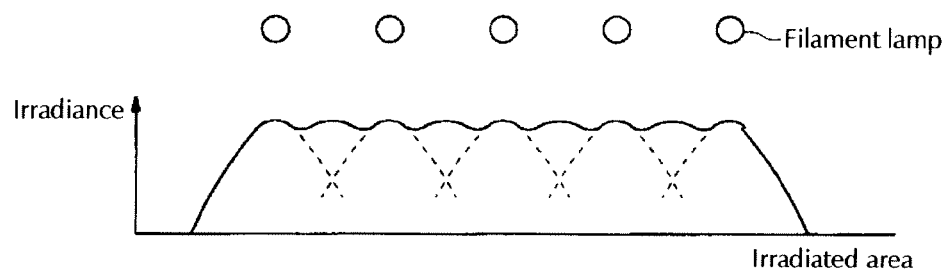
FIGS. 5(a) to 5(c) each show a schematic of the relation between the number of filament lamps and the distribution of the irradiance on the irradiated surface.
Figure 5B:
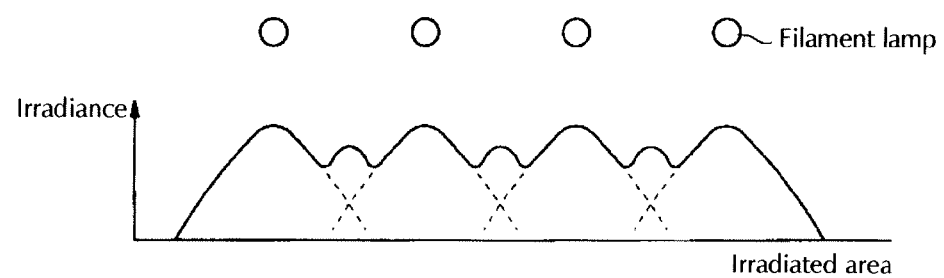
Figure 5C:
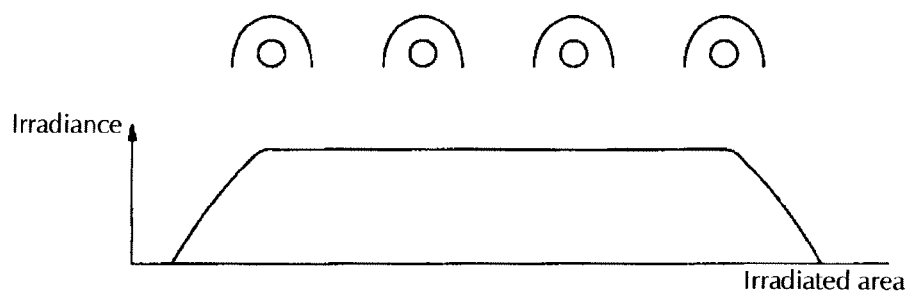

As is shown in FIG. 5(b), in the case of degradation of the distribution of the irradiance in the absence of a reflector 2, by arrangement of the reflector as shown in FIG. 5(c), the distance L1 and the like between the filament lamps adjacent to one another can be increased without adversely affecting the distribution of the irradiance with respect to the wafer 6. In this way, the number of filament lamps can be reduced even more and thus the number of power sources can be reduced. This measure is therefore even more advantageous with respect to costs.

The reason for the irradiation distance H between the light source parts 10, 20 and the wafer 6 which constitutes the article to be treated which is greater than the distance D between the filament lamps which are adjacent to one another is described below.

Figure 14A:
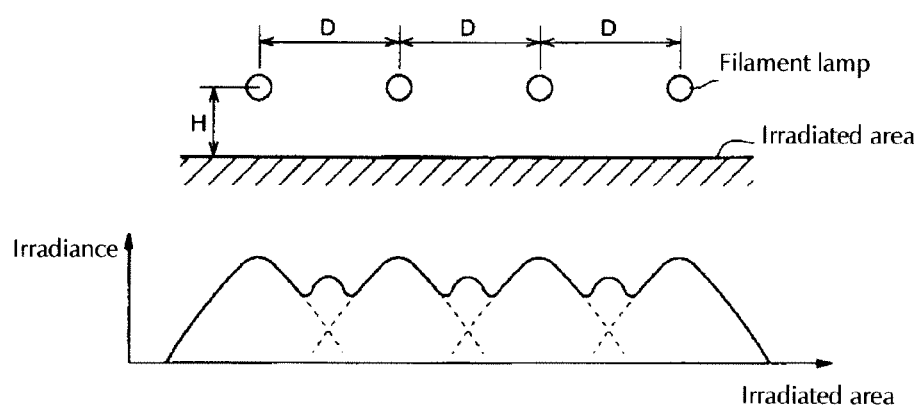
FIGS. 14(a) & 14(b) each show the relationship between the irradiation distance H as the distance between the bulb axis of the respective filament lamps which forms the light source part and the wafer surface, and the distance D between the respective filament lamps and the distribution of the irradiance on the irradiated surface of the wafer.
Figure 14B:
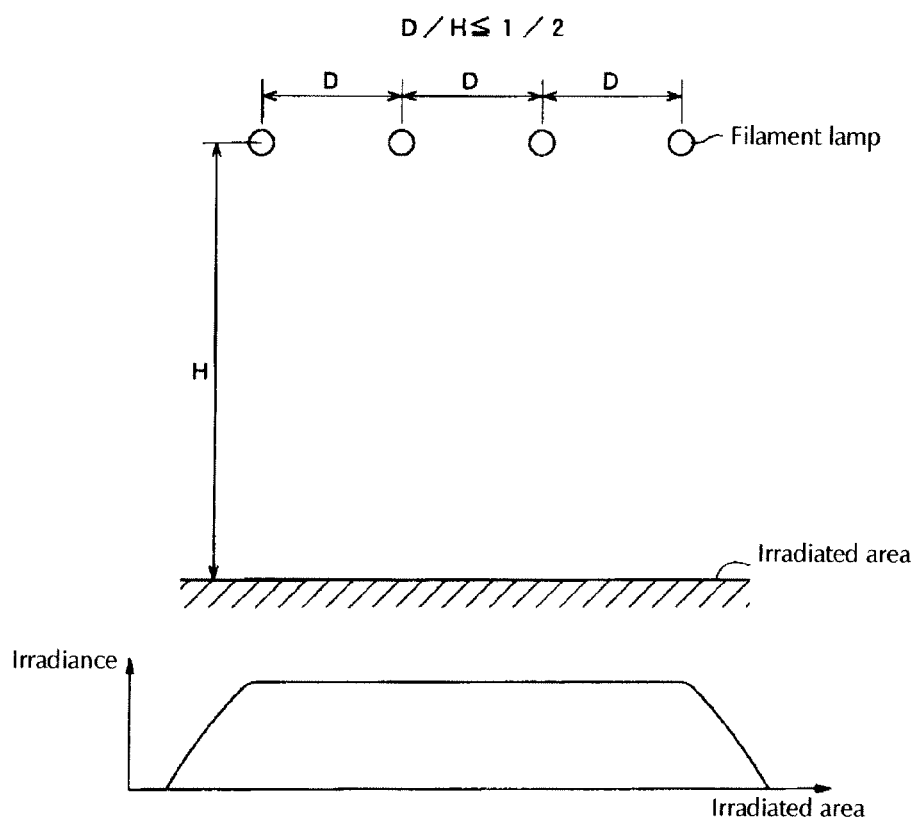

FIGS. 14(a) & 14(b) each schematically show the relation between the irradiation distance H which represents the distance between the bulb axes of the respective filament lamp of the light source parts and the surface of the wafer 6, the distance D between the respective filament lamps (L1, L2, L3, etc. in FIGS. 9 to 11) and the distribution of the irradiance on the irradiated surface for the wafer 6.

FIG. 14(a) is a schematic of the distribution of the irradiance on the irradiated surface for the wafer 6 when the relation between the irradiation distance H and the distance D is $D/H > \frac{1}{2}$.

As is apparent from FIG. 14(a), the deviation in the distribution of the irradiance at $D/H > \frac{1}{2}$ is great and the uniformity of the distribution of the irradiance is not good.

FIG. 14(b) is a schematic of the distribution of the irradiance on the irradiated surface for the wafer 6 when the relation between the irradiation distance H and the distance D is $D/H \leq \frac{1}{2}$.

As is apparent from FIG. 14(b), the deviation in the distribution of the irradiance at $D/H \leq \frac{1}{2}$ is great and the uniformity of the distribution of the irradiance is good.

When the distance between the light source parts and the wafer which constitutes the article to be treated is small, the light images on the wafer surface often reflect the arrangement of the filament lamps. That is, the images of the light which is radiated from several filament lamps which are apart from one another and are located parallel to one another, have only a small region in which they come to rest on one another. As a result they become discrete on the wafer surface, by which the distribution of the illuminance on the wafer surface becomes the distribution shown in FIG. 14(a) with poor uniformity.

On the other hand, the light images on the wafer surface diffuse to a certain extent, since in the case of a large distance between the light sources and the wafer which constitutes the article to be treated, the light radiated from the respective filaments onto the wafer surface is diffuse light. The images of the light irradiated by several filament lamps which are apart from one another and parallel to one another therefore have a larger region in which they come to rest on one another. The light radiated onto the wafer surface is therefore brought essentially to an average value and in the distribution of the irradiance on the wafer surface the uniformity is good, as is shown in FIG. 14(*b*).

As a result of the experiments of the inventors, it was found that, in the case of the relation between the irradiation distance H and the distance D of D/H≦½, the distribution of the irradiance shown in FIG. 14(*b*) with good uniformity is obtained. It was found that especially by placement of a reflector which reflects the light from the light source parts onto the side of the wafer which constitutes the article to be treated, and by suitable setting of the shape of the reflector the distribution of irradiance shown in FIG. 14(*b*) with advantageous uniformity is obtained, even if the relation between the irradiation distance H and the distance D is represented by D/H≦1. In other words, the distance D (L1 and the like) between the filament lamps adjacent to one another can be fixed in the range in which it does not exceed the irradiation distance H between the filament lamps 1 and the wafer 6.

In the case of the heating device of the light irradiation type shown in FIG. 8, it is desirable that the above described irradiation distance H is the distance between the bulb axes of the respective filament lamps of the light source part 20 and the surface of the wafer 6 which constitutes the article to be treated since the distance between the light source part 20 and the wafer 6 which constitutes the article to be treated is less than the distance between the light source part 10 and the wafer 6.

In FIG. 8, in the light source part holding space S1, cooling air from a cooling air unit 8 is supplied from a blowout opening 82 of the cooling air supply nozzle 81 which is located in the chamber 300. The cooling air delivered into the light source part housing space S1 is blown onto the respective filament lamp 1 in the first and second light source parts 10 and 20 and cools the bulb 11 of the respective filament lamp 1. The hermetically sealed portions 12*a*, 12*b* of the respective filament lamp 1 have a lower thermal resistance than at other locations. It is therefore desirable for the blowout opening 82 of the cooling air supply nozzle 81 to be located opposite the hermetically sealed portions 12*a*, 12*b* of the respective filament lamp 1 and to preferably cool the hermetically sealed portions 12*a*, 12*b*. The cooling air which is blown onto the respective filament lamp 1 and which has reached a high temperature by heat exchange is released through the cooling air outlet opening 83 located in the chamber 300. The cooling air flows with consideration of the fact that the cooling air which has reached a high temperature by heat exchange does not conversely heat the respective filament lamp 1.

For the above described cooling air, the air flow is controlled such that the reflector 2 is cooled at the same time. When the reflector 2 is water-cooled by a water cooling device not shown in the drawings, the air flow however need not be structured such that the reflector 2 is cooled at the same time.

In the silica glass window 4, heat storage occurs due the radiant heat from the wafer to be heated 6. There are cases in which the heat radiation which is emitted on a secondary basis from the silica glass window 4 which has stored the heat exerts an unwanted thermal effect on the article to be treated 6.

In this case, the disadvantages of redundancy of temperature controllability of the article to be treated 6 (for example overshoot, in which the temperature of the article to be treated is higher than the set temperature), of a reduction in temperature uniformity in the article to be treated 6 as a result of temperature scattering of the silica glass window 4 in which heat is stored, and similar disadvantages arise. Furthermore, it becomes difficult to increase the rate of temperature decrease of the article to be treated 6.

To eliminate these disadvantages, it is therefore also desirable to arrange the blowout opening 82 of the cooling air supply nozzle 81 as shown in FIG. 8 in the vicinity of the silica glass window 4 and to cool the silica glass window 4 by the cooling air from the cooling air unit 8.

The respective filament lamp 1 of the first light source part 10 is supported by a pair of first fixing frames 500 and 501. The first fixing frames each consist of an electrically conductive frame 51 of an electrically conductive component and of a holding frame 52 which is formed from an insulating component of ceramic or the like. The holding frame 52 is located on the inside wall of the chamber 300 and secures the electrically conductive frame 51.

When the number of filament lamps 1 of the first light source part 10 is n1 and the number of filaments of filament lamps formed by division is m1 and power is supplied to all filaments independently of one another, the combination number of the pair of first fixing frames 500 and 501 is n1×m1. On the other hand, the respective filament lamp 1 of the second light source part 20 is supported by second fixing frames which like the first fixing frames each consist of an electrically conductive frame and a holding frame. When the number of filament lamps 1 of the second light source part 20 is n2 and the number of filaments of the filament lamp formed by division is m2 and power is supplied to all filament bodies independently of one another, the combination number of the pair of second fixing frames is n2×m2.

In the chamber 300 there is a pair of ports 71, 72 for the main current supply to which the feed lines from the feed devices of the current source part 7 are connected. In FIG. 8, a pair of ports 71, 72 for the main current supply is shown. The number of ports for the main current supply is however fixed according to the number of filament lamps 1, the number of filaments within the respective filament lamp, and the like.

In the heating device of the light irradiation type as shown in FIG. 8, the port 71 for the main current supply is electrically connected to the electrically conductive frame 51 of the first lamp fixing frame 500. Furthermore, the port 72 for the main current supply is electrically connected to the electrically conductive frame 51 of the first lamp fixing frame 501.

The electrically conductive frame 51 of the first lamp fixing frame 500 is electrically connected for example to the outer lead 18*a* (see FIG. 13) which is the feed device of a filament lamp of the first light source part 10. The electrically conductive frame 51 of the first lamp fixing frame 501 is electrically connected for example to the outer lead 18*f* (see FIG. 13). This arrangement enables supply of the filament 1C-1 of one filament lamp 1 of the first light source part 10 by the feed device.

The other filament bodies 1C-2, 1C-3 of the filament lamp 1, the respective filament of the other filament lamps 1 of the first light source part 10 and the respective filament of the respective filament lamp 1 of the second light source part 20 are electrically connected in the same way by another pair of ports 71, 72 for the main current supply.

Furthermore, depending on the type of heat treatment a process gas unit 800 can also be connected to the heat treatment space S2 and it delivers or evacuates process gas. In the case for example of carrying out a thermal oxidation process a process gas unit 800 is connected to the heat treatment space S2 and delivers or evacuates oxygen gas and a purge gas (for example, nitrogen gas) for purging the heat treatment space S2. The process gas and the purge gas from the process gas unit 800 are delivered from a blowout opening 85 of a gas supply nozzle 84 located in the chamber 300 into the heat treatment space S2. Evacuation takes place through an outlet opening 86.

In FIG. 9, 15 filament lamps are arranged over a wafer with an outside diameter of 300 mm such that the distance L1 between filaments adjacent to one another for a filament lamp group U1 is 24 mm, the distance L2 between filaments adjacent to one another for a filament lamp group U2 is 20 mm, and the distance L3 between filaments adjacent to one another for a filament lamp group U3 is 16 mm.

Assuming that an attempt is made to cover the region composed of the wafer and guard ring by fixing the conventional distance of 16 mm between the filament lamps which are adjacent to one another, 19 filament lamps are required.

In the case as shown in FIG. 9, therefore four filament lamps of the filament lamps of the light source part 10 can be saved and likewise for the light source part 20, by which a total of eight filament lamps can be saved. In this way, the number of feed parts which are connected to the filament lamps can be reduced, by which the effects are obtained that the current source part is made smaller and the costs for producing the heating device of the light irradiation part can be suppressed.

As shown in FIGS. 10 & 11, in a region with an outside diameter of 350 mm consisting of a wafer with an outside diameter of 200 mm and a guard ring with a width of 75 mm, there are 19 filament lamps such that the distance L1 between the filaments which are adjacent to one another for the filament lamp group U1 is 24 mm, the distance L2 between the filaments adjacent to one another for the filament lamp group U2 is 20 mm and the distance L3 between the filaments adjacent to one another for the filament lamp group U3 is 16 mm.

Assuming that an attempt is made to cover the region composed of the wafer and the guard ring by fixing the conventional distance of 16 mm between the filament lamps adjacent to one another, 23 filament lamps are required.

In the case as shown in FIGS. 10 & 11, therefore, four filament lamps from the filament lamps of the light source part 10 can be saved and likewise for the light source part 20, by which a total of eight filament lamps can be saved. In this way, the number of feed parts which are connected to the filament lamps can be reduced, by which the effects are obtained that the current source part is made smaller and the costs for producing the heating device of the light irradiation part can be reduced.

If filament lamps with the same rated wattage density (290 W/cm) as the filament lamps 1H to 1L are uniformly arranged by fixing the distance between the filament lamps adjacent to one another of 24 mm, it is theoretically imaginable that the number of filament lamps can be reduced even more. However, this arrangement cannot be undertaken since the following disadvantages occur in practice.

1. In the filament lamps which belong to the filament lamp groups U2, U3, in the vicinity of the filament lamp group in the center area of the light source part, the total length of the filaments located directly above the guard ring is greater than the total length of the filaments of the filament lamps belonging to the filament lamp group U1 in the center region of the light source part. For example, if the filament 1C-1 is compared to the filament 1J-1, the filament 1C-1 is obviously longer. In this connection, for filament lamps with a filament with a great total length, the disadvantages of deformation of the silica glass comprising the bulb, and furthermore devitrification of the silica glass by recrystallization occur, because the tube wall temperature increases in the vicinity of the center region of the filament in which the heat dissipates by heat transfer only with difficulty.

2. To prevent the first disadvantage, if cooling conditions (the amount of cooling air) are established under which the bulb wall in the vicinity of the center region of the filament is adequately cooled, a region with a low rated wattage density of the filament lamp is cooled to excess, by which the halogen cycle no longer functions normally and by which the lamp survive life is shortened.

The reason for limiting the distance between the filament lamps facing one another due to this heat, as was described above, is that a high setting of the rated wattage density of the filament which extends to the temperature limit of the bulb of the filament lamp due to the demand for a temperature increase with a high rate of 250° C./second comprises an essential condition.

As the filament lamp in accordance with the invention, one with a bulb in the shape of a rod-shaped bulb was described above. The filament lamp in accordance with the invention is however of course not limited thereto. Specifically it can also have a shape in which part of the bulb is bent or has a similar shape.

What is claimed is:

1. Heating device of the light irradiation type, comprising: at least one light source part in which several filament lamps are located extending parallel to one another, and in which at least one of said filament lamps comprises several filaments which are located along the bulb axis of the bulb and which are supplied with power individually in order to produce light which radiates from the light source part onto an article to be treated, wherein the distance between at least some of the adjacent filament lamps is nonuniform, wherein the filament lamps are arranged in groups, the distance between the adjacent filament lamps differing from group to group, and wherein the first filament lamp group is located in a center region and the second filament lamp groups are located laterally from the first filament lamp group, wherein the distance between the adjacent filament lamps within the first filament lamp group is greater than the distance within the second filament lamp groups.

2. Heating device of the light irradiation type in accordance with claim 1, wherein the distance between the filament lamps is defined as the distance between the longitudinal central axes of the filaments of adjacent filament lamps.

3. Heating device of the light irradiation type in accordance with claim 1, wherein the article to be treated is a semiconductor wafer.

4. Heating device of the light irradiation type in accordance with claim 1, wherein the article to be treated is a semiconductor wafer which is held by a guard ring.

5. Heating device of the light irradiation type in accordance with claim 1, wherein there are two light source parts defining a space for the article to be treated between them.

6. Heating device of the light irradiation type in accordance with claim 1, wherein the light source parts each have a reflector to reflect the light radiated from the filament lamps onto the article to be treated.

7. Heating device of the light irradiation type in accordance with claim 1, wherein the comparison expression $D/H \leq 1$ is satisfied, D being the distance between the filament lamps which are adjacent to one another and H being the distance between the filament lamps and the article to be treated.

8. Heating device of the light irradiation type in accordance with claim 1, comprising filament lamps in which several filaments which are located along the bulb axis of the bulb and which are supplied with power individually such that a rated wattage density of the filaments which are located opposite a peripheral region of the article to be treated is greater than the rated wattage density of the filaments which are located opposite the center region of the article to be treated.

* * * * *